United States Patent
Ruffo et al.

(10) Patent No.: US 12,233,656 B2
(45) Date of Patent: Feb. 25, 2025

(54) METHOD OF PERFORMING SCREEN PRINTING ON A SUBSTRATE USED FOR THE MANUFACTURE OF A SOLAR CELL, CONTROLLER AND APPARATUS FOR PERFORMING SAME

(71) Applicant: APPLIED MATERIALS ITALIA S.R.L., San Biagio di Callalta (IT)

(72) Inventors: Alberto Emilio Ruffo, Casale sul Sile (IT); Marco Galiazzo, Quinto di Treviso (IT); Davide Colla, Treviso (IT); Daniele Andreola, Povegliano (IT); Daniele Gislon, Venice (IT)

(73) Assignee: APPLIED MATERIALS ITALIA S.R.L., San Biagio di Callalta (IT)

( * ) Notice: Subject to any disclaimer, the term of this patent is extended or adjusted under 35 U.S.C. 154(b) by 0 days.

(21) Appl. No.: 18/685,968

(22) PCT Filed: Aug. 25, 2021

(86) PCT No.: PCT/EP2021/073472
§ 371 (c)(1),
(2) Date: Feb. 23, 2024

(87) PCT Pub. No.: WO2023/025377
PCT Pub. Date: Mar. 2, 2023

(65) Prior Publication Data
US 2024/0262118 A1    Aug. 8, 2024

(51) Int. Cl.
*B41F 15/08*    (2006.01)
*B41F 15/42*    (2006.01)
(Continued)

(52) U.S. Cl.
CPC .......... *B41M 1/12* (2013.01); *B41F 15/0818* (2013.01); *B41F 15/423* (2013.01); *B41F 15/44* (2013.01);
(Continued)

(58) Field of Classification Search
CPC .... B41F 15/0818; B41F 15/423; B41F 15/44; B41M 1/12; B41M 3/008;
(Continued)

(56) References Cited

U.S. PATENT DOCUMENTS

2017/0021610 A1    1/2017  Takahashi

FOREIGN PATENT DOCUMENTS

CN        207916263 U    *   9/2018
EP          2993044 A2        3/2016
(Continued)

OTHER PUBLICATIONS

International Search Report and Written Opinion for International Application No. PCT/EP2021/073472 dated Apr. 26, 2022.

*Primary Examiner* — Christopher E Mahoney
*Assistant Examiner* — Marissa Ferguson-Samreth
(74) *Attorney, Agent, or Firm* — Patterson + Sheridan, LLP

(57) ABSTRACT

A method of performing screen printing on a substrate used for the manufacture of a solar cell is provided. The method includes moving a print head over a screen by a first drive actuator to perform a printing stroke in a first direction. The method includes moving a material processing head in the first direction by a second drive actuator to perform a material processing stroke behind the print head. The print head is moved away from the material processing head by the first drive actuator during a distance increasing phase of the printing stroke to increase a separation distance between the print head and the material processing head.

18 Claims, 14 Drawing Sheets

(51) Int. Cl.
  *B41F 15/44* (2006.01)
  *B41M 1/12* (2006.01)
  *B41M 1/26* (2006.01)
  *B41M 3/00* (2006.01)
  *H01L 31/0224* (2006.01)
  *H01L 31/18* (2006.01)

(52) U.S. Cl.
  CPC .............. *B41M 1/26* (2013.01); *B41M 3/008* (2013.01); *H01L 31/022433* (2013.01); *H01L 31/18* (2013.01); *B41P 2200/40* (2013.01); *B41P 2215/50* (2013.01)

(58) Field of Classification Search
  CPC ............. H01L 31/022433; H01L 31/18; B41P 2200/40; B41P 2215/50
  See application file for complete search history.

(56) References Cited

FOREIGN PATENT DOCUMENTS

| | | | | |
|---|---|---|---|---|
| GB | 2458313 A | * | 9/2009 | .......... B41F 15/0818 |
| WO | 2018/197005 A1 | | 11/2018 | |
| WO | WO-2018197007 A1 | * | 11/2018 | |
| WO | WO-2019129344 A1 | * | 7/2019 | .............. B41F 15/08 |

\* cited by examiner

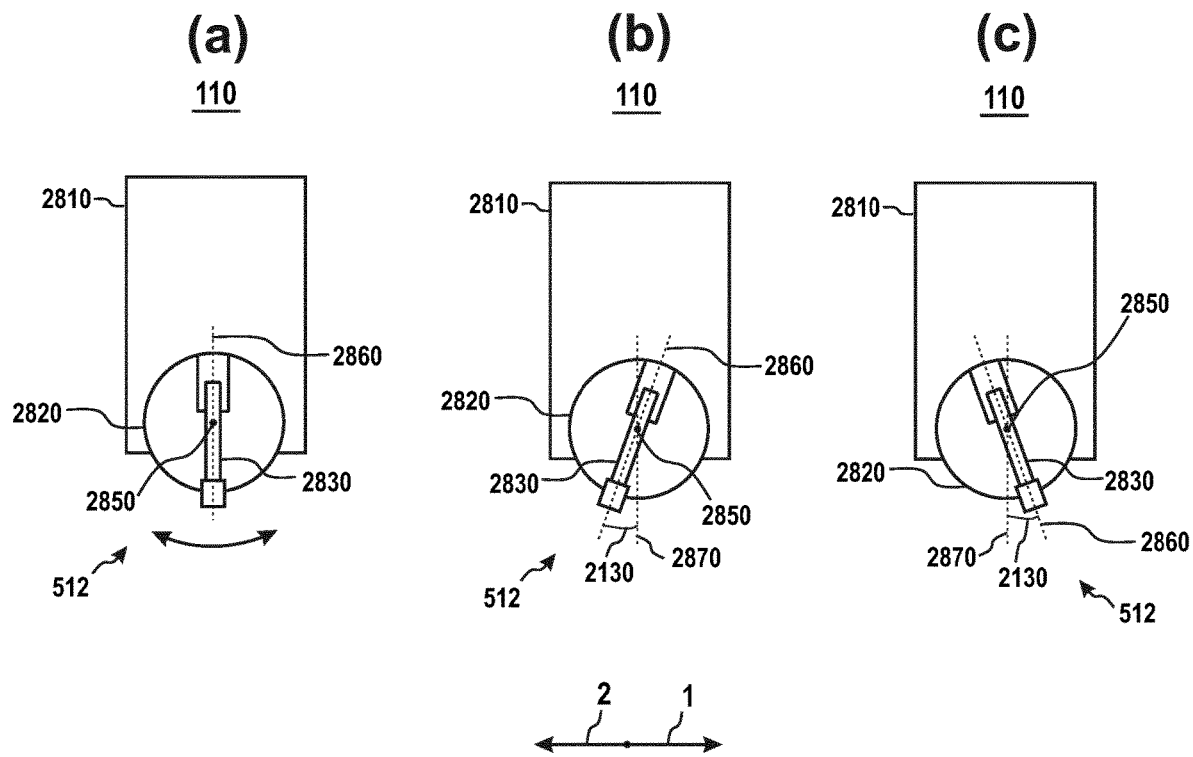
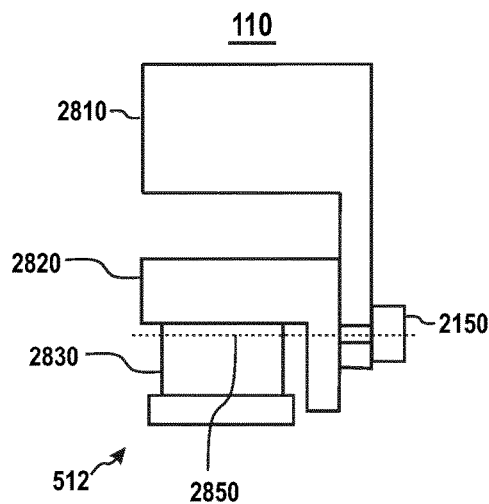

Fig. 30
(a)
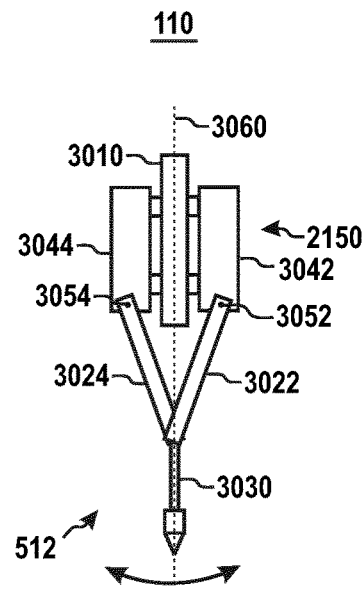
(b) 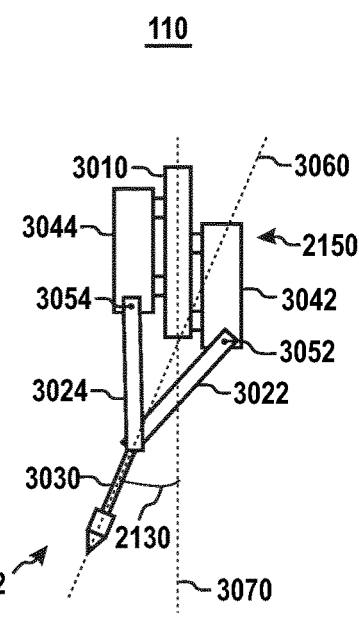   (c) 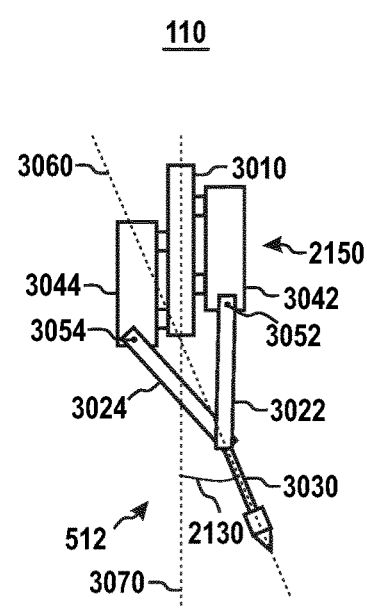

Fig. 31
(a)
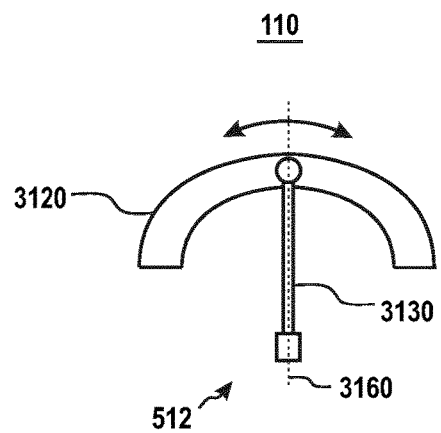
(b) (c)
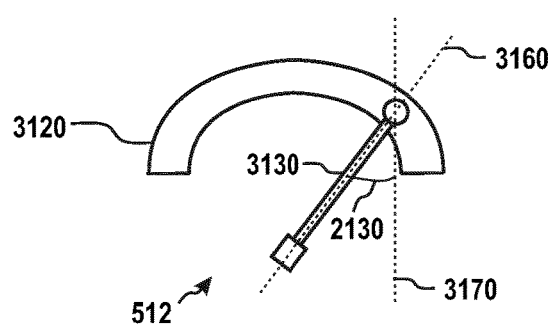 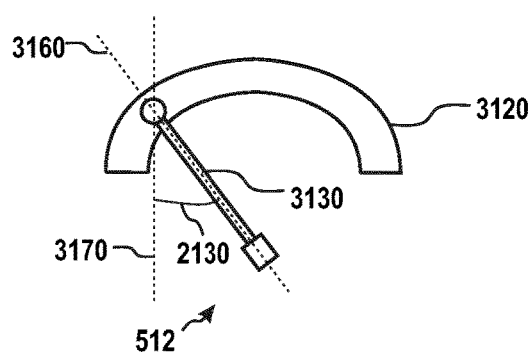
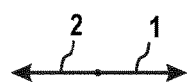

METHOD OF PERFORMING SCREEN PRINTING ON A SUBSTRATE USED FOR THE MANUFACTURE OF A SOLAR CELL, CONTROLLER AND APPARATUS FOR PERFORMING SAME

FIELD

Embodiments of the present disclosure relate to a method of performing screen printing on a substrate used for the manufacture of a solar cell. Embodiments of the present disclosure specifically relate to methods wherein a squeegee performs a print stroke to urge deposition material through a screen, and wherein a flooder performs a flood stroke to process deposition material on the screen. Embodiments of the present disclosure relate to an apparatus for performing screen printing on a substrate used for the manufacture of a solar cell, and to a controller for an apparatus for performing screen printing on a substrate used for the manufacture of a solar cell.

BACKGROUND

Solar cells are photovoltaic structures that convert sunlight directly into electrical power. Solar cells can be produced on a crystalline silicon base using deposition techniques, particularly printing techniques, achieving on the front surface of the solar cells a structure of selective emitters.

A processing cycle can include at least one printing operation during which material is deposited on the substrate, and an optional further material processing operation. During a printing operation, a squeegee may exert a pressure on a screen to urge deposition material through the screen so that the deposition material is deposited, i.e. printed, on the substrate below the screen. During a material processing operation, a flood bar can move over the screen to provide a layer of deposition material on the screen, in preparation of a subsequent printing operation. For example, in the production of solar cells, screen printing can be used to print a conductive pattern including bus bars and fingers on a substrate, such as a silicon substrate.

In light of increasing demands as regards cycle time, precision of the printing process and quality of the pattern that is to be printed on the substrate, there is a need for improvement.

In view of the above, new methods of performing screen printing on a substrate used for the manufacture of a solar cell, apparatuses for performing screen printing on a substrate used for the manufacture of a solar cell, and a controller for the same are beneficial.

SUMMARY

According to an embodiment, a method of performing screen printing on a substrate used for the manufacture of a solar cell is provided. The method includes moving a print head over a screen by a first drive actuator to perform a printing stroke in a first direction. The method includes moving a material processing head in the first direction by a second drive actuator to perform a material processing stroke behind the print head. The print head is moved away from the material processing head by the first drive actuator during a distance increasing phase of the printing stroke to increase a separation distance between the print head and the material processing head.

According to a further embodiment, a method of performing screen printing on a substrate used for the manufacture of a solar cell is provided. The method includes moving a print head over a screen by a first drive actuator from an initial position to a final position to perform a printing stroke in a first direction, the final position being spaced apart from the initial position by a total stroke distance of the printing stroke. The method includes moving a material processing head over the screen by a second drive actuator to perform a flooding stroke in the first direction. The print head is moved away from the flooder during at least a portion of the printing stroke to increase a separation distance between the print head and the material processing head. The flooding stroke is started when the print head reaches a target position spaced apart from the initial position by 50% or more of the total stroke distance.

According to a further embodiment, a controller for an apparatus for performing screen printing on a substrate used for the manufacture of a solar cell is provided. The controller is configured to control a first drive actuator to move a print head over a screen to perform a printing stroke in a first direction. The controller is configured to control a second drive actuator to move a material processing head over the screen to perform a material processing stroke in the first direction. Therein, the first drive actuator and the second drive actuator are controlled such that the material processing head is behind the print head during the material processing stroke, and such that the print head is moved away from the material processing head during a distance increasing phase of the printing stroke to increase a separation distance between the print head and the material processing head.

According to a further embodiment, an apparatus for performing screen printing on a substrate used for the manufacture of a solar cell is provided. The apparatus includes a screen. The apparatus includes a print head. The apparatus includes a first drive actuator connected to the print head to move the print head in at least a first direction. The apparatus includes a material processing head. The apparatus includes a second drive actuator connected to the material processing head to move the material processing head in at least the first direction. The apparatus includes a controller connected to the first drive actuator and the second drive actuator, the first drive actuator and the second drive actuator being individually controllable. The controller is configured to control the first drive actuator to move the print head over the screen to perform a printing stroke in the first direction. The controller is configured to control the second drive actuator to move the material processing head over the screen to perform a material processing stroke in the first direction. Therein, the material processing head is behind the print head during the material processing stroke, and the print head is moved away from the material processing head during a distance increasing phase of the printing stroke to increase a separation distance between the print head and the material processing head.

Embodiments are also directed at apparatuses for carrying out the disclosed method and include apparatus parts for performing each described method aspect. These method aspects may be performed by way of hardware parts, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following:

FIGS. 28-29 shows an example of a print head including a squeegee mounted to a rotatable support;

FIG. 30 shows an example of a print head including two linear actuators for adjusting an inclination angle of a squeegee;

FIG. 31 shows an example of a print head including a curved guide for adjusting an inclination angle of a squeegee;

DETAILED DESCRIPTION

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

FIGS. 1-4 illustrate a method of performing screen printing on a substrate used for the manufacture of a solar cell according to embodiments described herein. FIGS. 1-4 are provided in chronological order, meaning that the situation depicted in FIG. 1 occurs before the situation depicted in FIG. 2, the situation depicted in FIG. 2 occurs before the situation depicted in FIG. 3, and so on.

Figure 1:
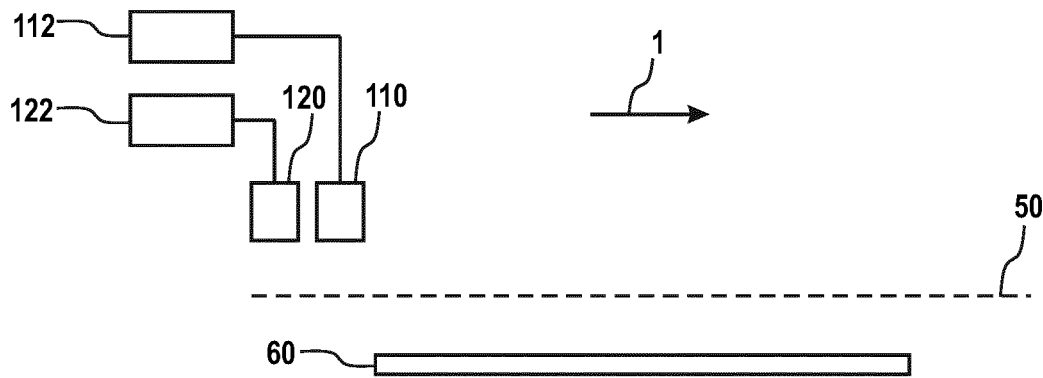
FIGS. 1-4 illustrate a method of performing screen printing on a substrate used for the manufacture of a solar cell, wherein a printing stroke and a material processing stroke are performed in a first direction.

FIG. 1 shows an apparatus 100 performing screen printing on a substrate used for the manufacture of a solar cell according to embodiments described herein. The apparatus 100 includes a print head 110 and a material processing head 120 adjacent to each other at a first side of a screen 50. The screen 50 may be above a substrate 60.

A substrate as described herein may be a substrate used for the manufacture of a solar cell, such as a semiconductor substrate, for example a silicon substrate. A substrate may be a thin, plate-like piece of material.

A print head as described herein may be configured for printing a pattern on a substrate, such as a conductive line pattern including one or more bus bars and/or one or more fingers. A print head may include a pressure application instrument for transferring deposition material from the screen to the substrate. The pressure application instrument may include one or more squeegees. During printing, a squeegee of the print head may exert a pressure to the screen for urging deposition material through the screen. The deposition material can be a material suitable to form a conductive line pattern, such as fingers and/or busbars, on a surface of the substrate. For example, the deposition material can be a paste, such as a silver paste.

A print head as described herein may not be configured for performing a material processing operation. A print head may not include a flooder. A print head may be for printing only.

A screen as described herein may include at least one of a net, a printing mask, a sheet, a metal sheet, a plastic sheet, a plate, a metal plate, and a plastic plate. The screen may define a pattern corresponding to a structure to be printed on the substrate, wherein the pattern may include at least one of holes, slots, incisions or other apertures. The pattern can correspond to a conductive line pattern to be printed on the substrate, such as a pattern including fingers and/or busbars of a solar cell. For example, the screen can have openings defining the conductive line pattern and a wire mesh provided within the openings. The deposition material to be deposited on the substrate can be provided as an essentially uniform layer on the screen by a material processing head, more specifically by a flooder of a material processing head. The deposition material may be prevented from flowing through the openings of the screen due to the presence of the wire mesh until a pressure is applied to the deposition material by a squeegee of the print head. During the printing process, a squeegee of the print head may urge the deposition material through the openings of the screen such that the deposition material is transferred to (i.e., printed on) the substrate.

The print head 110 may be connected to a first drive actuator 112 of the apparatus 100. The first drive actuator 112 may be configured to move, or drive, the print head 110 in a first direction 1 to perform a printing stroke. The material processing head 120 may be connected to a second drive actuator 122 of the apparatus 100. The second drive actuator 122 may be configured to move, or drive, the material processing head 120 in the first direction 1 to perform a material processing stroke.

The first direction 1 can be a substantially horizontal direction. The term "horizontal direction" is to be understood to distinguish over "vertical direction". That is, the "horizontal direction" relates to a substantially horizontal movement e.g. of a print head or material processing head, wherein a deviation of a few degrees, e.g. up to 5° or even up to 10°, from an exact horizontal direction is still considered as a "substantially horizontal direction".

A drive actuator as described herein, such as the first drive actuator 112 or the second drive actuator 122, may, for example, include a stepper motor, a linear motor, a brushless motor, such as a brushless motor combined with timing-belt linear transmission or a brushless motor combined with screw/nut linear transmission, or any combination thereof. A drive actuator may include a plurality of actuator units. A drive actuator may include at least one first actuator unit for moving the respective head (print head or material processing head) in the first direction 1 and at least one second actuator unit for moving said head in a second direction opposite to the first direction. Each actuator unit may be a motor as described above. The first drive actuator 112 and the second drive actuator may be connected to a controller (not shown). The first drive actuator 112 and the second drive actuator 122 may be individually controllable, or independent, actuators. The first drive actuator 112 may be controlled to drive the print head 110 and, independently thereof, the second drive actuator 122 may be controlled to drive the material processing head 120.

The first drive actuator 112 may move or drive the print head 110 away from the initial position shown in FIG. 1 to perform a printing stroke in the first direction 1. A printing stroke as described herein can be understood as a movement of a print head from an initial position at a first side of the screen 50 to a final position at a second side of the screen 50, wherein the print head 110 performs a printing operation during at least a portion of said movement. The first side and the second side of the screen 50 may be on opposite ends of the screen 50. The printing operation may include printing a deposition material on the substrate 60. The printing operation may be performed during substantially the entire duration of the printing stroke. A printing stroke may, for example, be a printing stroke in the first direction 1 as shown in FIGS. 1-4, or may be a printing stroke in a second direction opposite the first direction. A printing stroke may be a continuous movement from the initial position of the printing stroke to the final position of the printing stroke. The print head 110 may include a pressure application instrument that may include, e.g., a squeegee. While the print head performs the printing stroke, the pressure application instrument may apply a pressure to the screen 50 to transfer deposition material from the screen 50 to the substrate 60.

Figure 2:
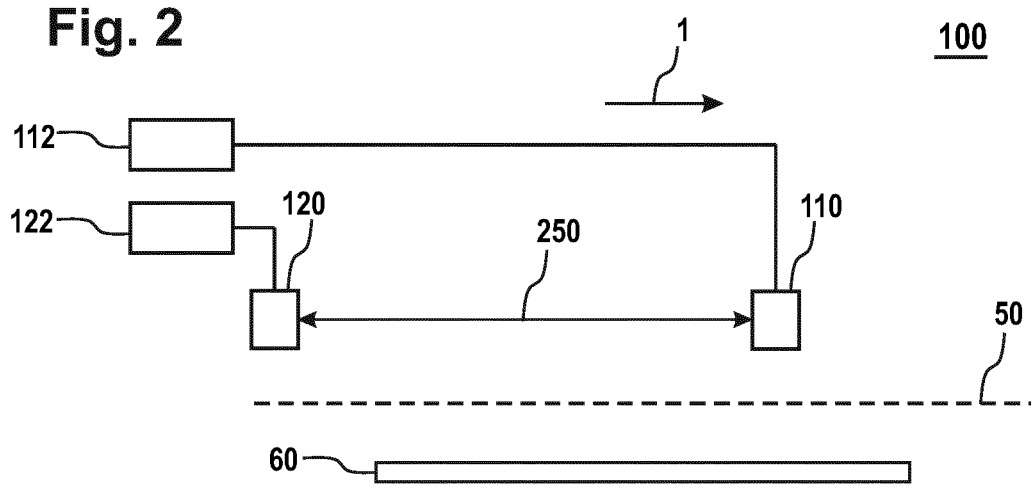

The position of the print head 110 shown in FIG. 1 can be understood as the initial position of a printing stroke that will be performed in the first direction 1. FIG. 2 shows the print head 110 during the printing stroke. The print head 110 shown in FIG. 2 has reached an intermediate position spaced apart from the initial position of the print head 110 with respect to the first direction 1. When the print head 110 has reached the intermediate position, the material processing head 120 may still be in the initial position as shown in FIG. 1. The print head 110 may be moved away from the material processing head 120 in the first direction 1 to increase a separation distance 250 between the print head 110 and the material processing head 120. The separation distance 250 can be understood as the distance between the print head 110 and the material processing head 120 in the first direction 1 (or in the second direction 2, in case the printing stroke and/or material processing stroke is performed in the second direction). The separation distance 250 is a variable distance that can increase and/or decrease during the course of a printing stroke performed by the print head and/or during the course of a material processing stroke performed by the material processing head 120.

A period during which the separation distance 250 between the print head 110 and the material processing head 120 is increased by moving the print head 110 away from the material processing head 120 may be referred to as a distance increasing phase. Accordingly, FIG. 2 illustrates a distance increasing phase of the printing stroke performed by the print head 110 in the first direction 1. According to some embodiments, a printing stroke may include a single distance increasing phase.

The second drive actuator 122 may move the material processing head 120 away from the initial position shown in FIG. 1 to perform a material processing stroke in the first direction 1. A material processing stroke can be understood as a movement of a material processing head from an initial position of the material processing stroke at a first side of the screen to a final position of the material processing stroke at a second side of the screen, wherein the material processing head 120 performs a material processing operation during at least a portion of said movement. The material processing operation may include processing deposition material on the screen. The material processing operation may be performed during substantially the entire duration of the material processing stroke. A material processing stroke may, for example, be a material processing stroke in the first direction 1, or may be a material processing stroke in a second direction opposite to the first direction. A material processing stroke may be a continuous movement from the initial position of the material processing stroke to the final position of the material processing stroke.

A material processing head as described herein (such as the material processing head 120 or the material processing head 1120 described below) may include a flooder, or flood bar. A material processing stroke may be a flooding stroke. Performing a flooding stroke may include distributing deposition material over an area of the screen, for example by a scraping movement of the flooder over the screen, to form a layer of deposition material on the screen. A flooding stroke may result in a substantially uniform layer of deposition material being formed on the screen. A flooding stroke may be performed in preparation of a subsequent printing stroke that will be performed by the print head, for example a subsequent printing stroke that will be performed in a direction opposite to a direction in which the flooding stroke was performed. During the subsequent printing stroke, the layer of material formed on the screen by the flooder during the preceding flooding stroke may be transferred from the screen to a substrate by the print head, particularly by a pressure application instrument of the print head as described herein.

A material processing head as described herein may not be configured for performing a printing operation. A material processing head may not include a squeegee. A material processing head may be for material processing only.

The position of the material processing head 120 shown in FIGS. 1 and 2 can be understood as the initial position of a material processing stroke that will be performed in the first direction 1. The second drive actuator 122 may move the material processing head 120 in the first direction 1, away from the initial position, to perform the material processing stroke. The material processing stroke in the first direction 1 may start after the printing stroke in the first direction 1 has started. The material processing stroke in the first direction 1 may start before the printing stroke in the first direction 1 has ended. For example, the material processing stroke may start when the print head 110 has reached the intermediate position shown in FIG. 2. The material processing stroke may start when the print head 110 reaches a target position. The target position may be spaced apart from the initial position of the print stroke by a distance of, for example, 50% or more, 70% or more, or even 90% or more, of the total stroke distance of the printing stroke. The target position may substantially correspond to a position of an edge of the substrate, such as the edge on the right-hand side of the substrate 60 shown in FIGS. 1-4. The terminology that the target position "substantially corresponds to a position of an edge of the substrate" can be understood in the sense that a horizontal offset of the target position with respect to the edge of the substrate is 5% or less of the total stroke distance. The material processing stroke may be performed behind the printing stroke. The term "behind" can be understood in the sense that, during the entire material processing stroke, the print head 110 is ahead of, or precedes, the material processing head 120 with respect to the first direction 1. In FIGS. 1-4, the material processing head 120 is behind the print head 110 with respect to the first direction 1.

Figure 3:
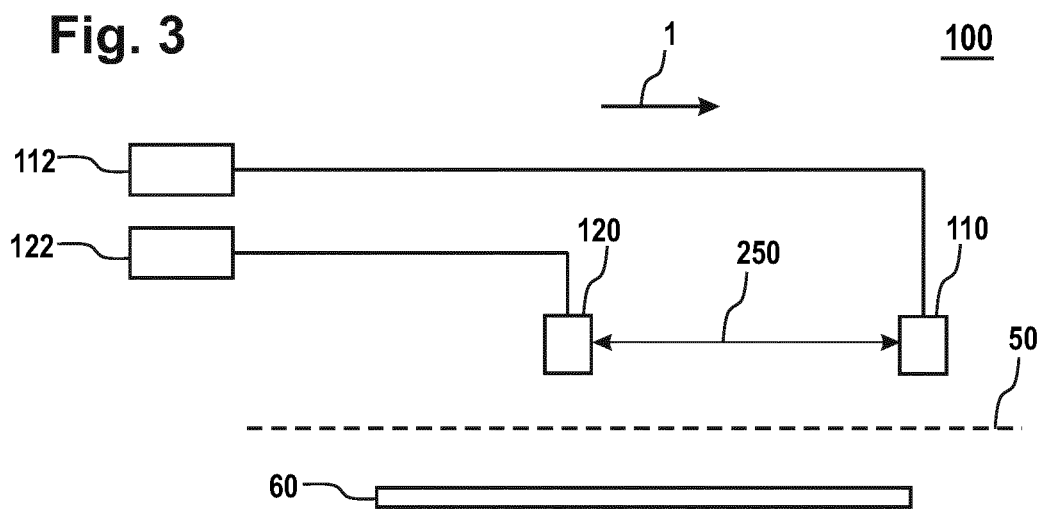

FIG. 3 shows the material processing head 120 and the print head 110 while performing the material processing stroke and the printing stroke, respectively. The material processing head 120 shown in FIG. 3 has reached an intermediate position that is spaced apart, in the first direction 1, from the initial position of the material processing head 120. The material processing head 120 is behind the print head 110. The print head 110 is ahead of, or precedes, the material processing head 120 with respect to the first direction 1. As compared to the intermediate position of the print head 110 as shown in FIG. 2, the print head 110 shown in FIG. 3 has moved forward in the first direction 1.

As illustrated in FIGS. 1-4, the material processing stroke in the first direction 1 may be performed faster than the printing stroke in the first direction 1. The average speed of the material processing head 120 during the material processing stroke in the first direction 1 may be higher than the average speed of the print head 110 performing the printing stroke in the first direction 1. For example, the average speed of the material processing head 120 may be 150% or more, 200% or more, or even 300% or more of the average speed of the print head 110. The material processing head 120 shown in FIG. 3 has gained upon the print head 110. The material processing head 120 may be moved, or driven, towards the print head 110 to decrease the separation distance 250 between the print head 110 and the material processing head 120. The separation distance 250 shown in FIG. 3 is smaller than the separation distance 250 shown in FIG. 2.

A period during which the separation distance 250 between the print head 110 and the material processing head 120 is decreased by moving the material processing head 120 towards the print head 110 may be referred to as a distance decreasing phase. Accordingly, FIG. 3 illustrates a distance decreasing phase of the material processing stroke performed by the material processing head 120 in the first direction 1. According to some embodiments, a material processing stroke may include a single distance decreasing phase.

Figure 4:
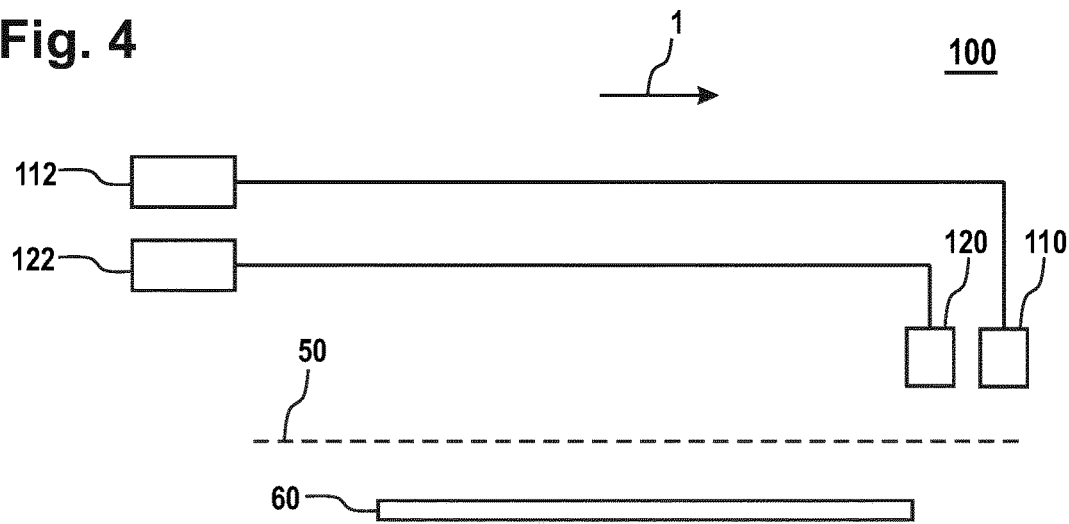

FIG. 4 shows the print head 110 and the material processing head 120 adjacent to each other in the respective final positions of the printing stroke and the material processing stroke at the second side of the screen. The print stroke and the material processing stroke in the first direction 1 have ended.

Embodiments described herein involve increasing the separation distance 250 between the print head 110 and the material processing head 120 (distance increasing phase) during a printing stroke and/or material processing stroke. In this respect, embodiments described herein differ from systems where the print head and the material processing head remain close to each other throughout the printing/material processing stroke. Embodiments described herein particularly differ from systems where, instead of having a print head 110 and a separate material processing head 120 that can be driven independently of each other, the flood bar is mounted to the print head so that the distance between the flood bar and the squeegee cannot be varied in the first place. Increasing the separation distance 250 has the advantage that more space is provided for performing the material processing operation. For example, by increasing the separation distance 250, an excessive accumulation of deposition material on the screen 50 in the space between the material processing head 120 and the print head 110 can be reduced or even avoided. A reduced accumulation of deposition material on the screen 50 allows the material processing head 120 to prepare a layer of uniform thickness over the screen 50, leading to an improved quality of the layer that is subsequently printed on the substrate 60.

Further, the deflection angle of the screen 50 resulting from a pressure exerted on the screen 50 by the squeegee of the print head 110 will be smaller if the print head 110 has already travelled a certain distance across the screen 50 in the first direction 1. In other words, at the time when the material processing stroke starts, the screen 50 will be flatter since the print head 110 has already performed a portion of the printing stroke. Having a substantially flat screen again allows for a more uniform layer of deposition material to be prepared on the screen 50 by the material processing head 120, and accordingly improves the quality of the printed layer on the substrate 60. Further, having a substantially flat screen also allows the material processing head to remain at a substantially constant vertical distance from the substrate 60 during the material processing stroke. The material processing stroke may be performed without a need for varying the vertical position of the material processing head during the material processing stroke, leading to a simpler set-up.

Embodiments described herein further involve decreasing the separation distance 250 (distance decreasing phase) during a printing stroke and/or material processing stroke. A distance decreasing phase has the advantage that the material processing head 120 can catch up to the print head 110 so that a least a portion of the time lost by delaying the start of the material processing stroke can be compensated for. The material processing stroke may be performed faster than the printing stroke, e.g. in a manner such that the printing stroke and the material processing stroke end at a substantially same time. The resulting overall cycle time (the total time used for performing a process cycle consisting of one printing stroke and one flooding stroke in the same direction) may be substantially the same as in a system where the material processing head and the print head move together during the entire stroke, i.e. at a constant separation distance.

FIGS. 1-4 show an example where the flooding stroke starts before the printing stroke has ended, i.e. before the print head 110 has reached the final position shown in FIG. 4. Starting the flooding stroke before the printing stroke has ended has the advantage that a process cycle can be performed faster, in other words the cycle time can be reduced, as described above. In other examples, the flooding stroke may start when or after the printing stroke has ended. The flooding stroke may start during a period when the squeegee (s) of the print head 110 is/are in an elevated position above the screen at the second end of the screen, so that the screen is fully flat when the flooding stroke starts.

In light of the above, according to an embodiment, a method of performing screen printing on a substrate used for the manufacture of a solar cell is provided. The method includes moving a print head (e.g. print head 110) over a screen by a first drive actuator to perform a printing stroke in a first direction. The method includes moving a material processing head (e.g. material processing head 120) in the first direction by a second drive actuator to perform a material processing stroke behind the print head. The print head is moved away from the material processing head by the first drive actuator during a distance increasing phase of the printing stroke to increase a separation distance between the print head and the material processing head.

The print head may be moved by the first drive actuator from an initial position of the printing stroke to a final position of the printing stroke to perform the printing stroke. The final position of the printing stroke may be spaced apart from the initial position of the printing stroke in the first direction by a total stroke distance of the printing stroke.

The material processing head may be moved by the second drive actuator from an initial position of the material processing stroke to a final position of the material processing stroke to perform the material processing stroke. The final position of the material processing stroke may be spaced apart from the initial position of the material processing stroke in the first direction by a total stroke distance of the material processing stroke.

The initial position of the printing stroke and/or the initial position of the material processing stroke may be at a first side of the screen. The first side may be adjacent to a first edge region of the screen. The final position of the printing stroke and/or the final position of the material processing stroke may be at a second side of the screen spaced apart from the first side. The second side may be adjacent to a second edge region of the screen opposite the first edge region. The first side and the second side may be on opposite ends of the screen.

The material processing head may be substantially stationary with respect to the first direction during the distance increasing phase of the printing stroke. The term "substantially stationary" can be understood in the sense that, during the distance increasing phase, the material processing head may not move forward or backward with respect to the first direction, or any such movement of the material processing head is at most a small movement over a short distance as compared to the distance covered by the print head during the distance increasing phase (a small movement may e.g. be a movement over a distance of 10% or less of the distance covered by the print head during the distance increasing phase), or is a movement performed at a low speed as compared to the speed of the print head during the distance increasing phase (a slow speed may e.g. be an average speed of 10% or less of the average speed of the print head during the distance increasing phase).

The material processing stroke in the first direction may start after the printing stroke in the first direction has started and/or before the printing stroke in the first direction has ended. The distance increasing phase, or at least a portion of the distance increasing phase, may be performed before the material processing stroke in the first direction has started.

A material processing stroke may start in the initial position of the material stroke. The start of a material processing stroke in the first direction can be understood as taking place at about the time when the material processing head begins to move in the first direction, away from the initial position of the material processing stroke, to perform the material processing stroke, e.g. the moment when the flooder of the material processing head starts moving in the first direction to process the deposition material on the screen. A printing stroke may start in the initial position of the printing stroke. The start of a printing stroke in the first direction can be understood as taking place at about the time when the print head begins to move in the first direction, away from the initial position of the printing stroke, to perform the printing stroke, e.g. the moment when the pressure application instrument of the print head starts moving in the first direction while applying a pressure to the screen for transferring the deposition material from the screen to the substrate. The start of a material processing stroke or a printing stroke in a second direction opposite the first direction may be understood analogously.

A material processing stroke may end in the final position of the material processing stroke. The end of a material processing stroke in the first direction can be understood as taking place at about the time when the material processing head reaches the final position of the material processing stroke and stops moving in the first direction. A printing stroke may end in the final position of the printing stroke. The end of a printing stroke in the first direction can be understood as taking place at about the time when the print head reaches the final position of the printing stroke and stops moving in the first direction. The end of a material processing stroke or a printing stroke in a second direction may be understood analogously.

The print head may be moved in the first direction from the initial position of the printing stroke to the final position of the printing stroke. The final position may be spaced apart from the initial position by a total stroke distance of the printing stroke. A maximum separation distance between the print head and the material processing head that is reached during the printing stroke may be 50% or more, 70% or more or even 90% or more of the total stroke distance. Said maximum separation distance may be reached during the distance increasing phase of the printing stroke. That the maximum separation distance is "reached" during the printing stroke or distance increasing phase means that there exists a moment during the printing stroke or distance increasing phase, respectively, when the separation distance between the print head and the material processing head is equal to said maximum separation distance. Having a maximum separation distance of 50% or more of the total stroke distance has the advantage that space is provided between the material processing head and the print head, so that there is no excessive accumulation of deposition material on the screen while the material processing stroke is performed. Where the percentage is increased from 50% to 70% or even 90%, said advantage is enhanced. A maximum separation distance below 50% of the total stroke distance may lead to a decreased printing quality, since in such case the deposition material accumulated by the operation of the flooder may be too close to the squeegee. The weight of said deposition material may push the screen downward right behind the squeegee and delay the detachment of the screen from the substrate behind the squeegee.

The material processing stroke in the first direction may start when the print head performing the printing stroke in the first direction reaches a target position. The target position may be spaced apart from the initial position of the printing stroke by 50% or more, 70% or more or even 90% or more of the total stroke distance of the printing stroke. The target position may substantially correspond to a position of a first edge of the substrate or a first edge of a substrate receiving region configured to receive the substrate. In other words, the material processing stroke may only start after a substantial portion of the printing stroke has been performed. Accordingly, the screen may be substantially flat at the time when the material processing stroke starts. Further, as described above, space is provided between the material processing head and the print head, so that there is no excessive accumulation of deposition material on the screen while the material processing stroke is performed.

The method described herein may include moving the material processing head toward the print head by the second drive actuator during a distance decreasing phase of the material processing stroke in the first direction to decrease the separation distance between the print head and the material processing head. The distance decreasing phase may be performed after the distance increasing phase. The distance decreasing phase, or at least a portion of the distance decreasing phase, may be performed before the printing stroke has ended. The distance increasing phase may include increasing the separation distance from a first separation distance to a second separation distance larger than the first separation distance. The distance decreasing phase may include decreasing the separation distance from the second separation distance to a third separation distance smaller than the second separation distance. The distance decreasing phase may be performed directly after the distance increasing phase. The terminology "directly after" may in this context be understood as follows. The moment when the distance decreasing phase starts may be substantially the same as the moment when the distance increasing phase ends. The distance increasing phase may start at a first time and end at a second time. At the second time, the separation distance may be equal to the second separation distance as described above. The distance decreasing phase may start at the second time or immediately after the second time. There may be no gap of time between the end of the distance increasing phase and the start of the distance decreasing phase.

An average stroke speed of the material processing head during the material processing stroke in the first direction may be higher than an average stroke speed of the print head during the printing stroke in the first direction, so that a duration of said material processing stroke may be shorter than a duration of said printing stroke. The average stroke speed of the material processing head during the material processing stroke may be 150% or more, 200% or more, or even 300% or more of the average stroke speed of the print head during the printing stroke. The average stroke speed of the material processing head during the material processing stroke may be at least twice as large as the average stroke speed of the print head during the printing stroke.

FIGS. 5-10 illustrate a method of performing screen printing on a substrate used for the manufacture of a solar cell according to embodiments described herein. FIGS. 5-10 show the print head 110, the material processing head 120, the first drive actuator 112, the second drive actuator 122, the screen 50 and the substrate 60 as described herein. FIGS. 5-10 show a substrate support 560 supporting the substrate 60. FIGS. 5-10 are provided in chronological order.

As illustrated in FIGS. 5-10, a print head 110 as described herein may include a pressure application instrument 512. The pressure application instrument 512 may be configured for applying a pressure to the screen 50 to transfer deposition material from the screen 50 to the substrate 60. The pressure application instrument 512 may include one or more squeegees.

As illustrated in FIGS. 5-10, the print head 110 may include, or be connected to, a vertical positioning actuator 514 of the apparatus 100. The vertical position actuator 514 may be connected to a controller as described herein. The vertical positioning actuator 514 may be configured to move the pressure application instrument 512 upwards and/or downwards, for example to adjust a vertical position of the pressure application instrument 512 with respect to the screen 50. The vertical positioning actuator 514 may be configured to adjust a pressure applied to the screen 50 by the pressure application instrument 512. The vertical position actuator 514 may be configured to adjust a vertical position of the pressure application instrument 512 before, after and/or during a printing stroke. The vertical positioning actuator 514 may be configured to move the print head including the pressure application instrument upward and/or downward, as shown in the figures, or may be configured to move the pressure application instrument upward and/or downward relative to the print head 110 while the print head 110 may remain stationary in a vertical direction.

As illustrated in FIGS. 5-10, a material processing head 120 as described herein may include a flooder 522, or flood bar. The flooder 522 may be configured for distributing deposition material over an area of the screen 50, as described above. The flooder 522 may be scraper shaped as a bar or a blade. The flooder 522 may have a length in a direction perpendicular to the direction of the material processing stroke (such as the first direction or the second direction).

As illustrated in FIGS. 5-10, the material processing head 120 may include, or be connected to, a vertical positioning actuator 524 of the apparatus 100. The vertical position actuator 524 may be connected to a controller as described herein. The vertical positioning actuator 524 may be configured to move the flooder 522 upwards and/or downwards, for example to adjust a vertical position of the flooder 522 with respect to the screen 50. The vertical positioning actuator 524 may be configured to adjust a vertical position of the flooder 522 before, after and/or during a material processing stroke. The vertical positioning actuator 524 may be configured to move the material processing head 120 including the flooder 522 upward and/or downward, as shown in the figures, or may be configured to move the flooder upward and/or downward relative to the material processing head while the material processing head may remain stationary in a vertical direction.

Figure 5:
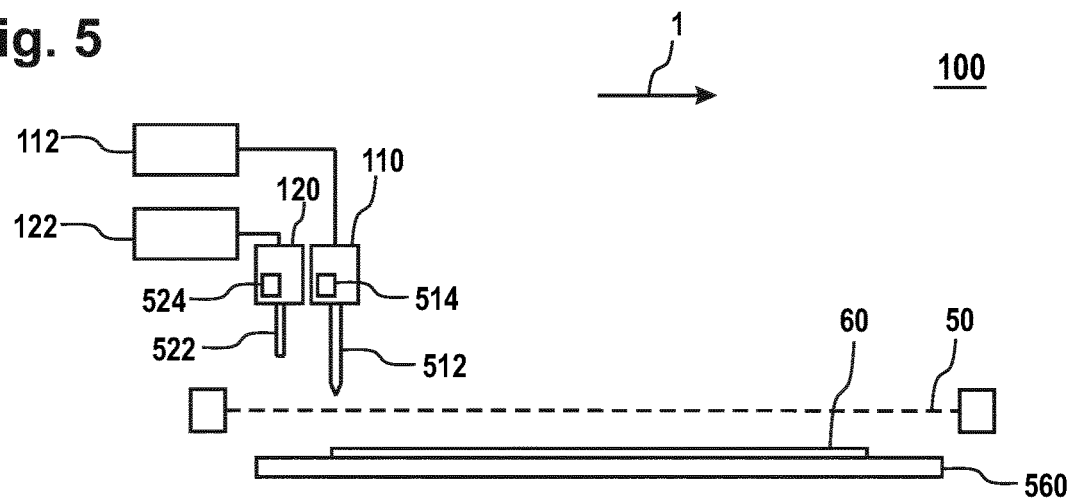
FIGS. 5-10 illustrate a method of performing screen printing on a substrate used for the manufacture of a solar cell, wherein a printing stroke and a material processing stroke are performed in a first direction.

FIG. 5 shows the print head 110 and the material processing head 120 at a first end of the screen 50. The print head 110 and the material processing head 120 are in an elevated position above the screen 50. Neither the printing stroke nor the material processing stroke in the first direction 1 have started.

Figure 6:
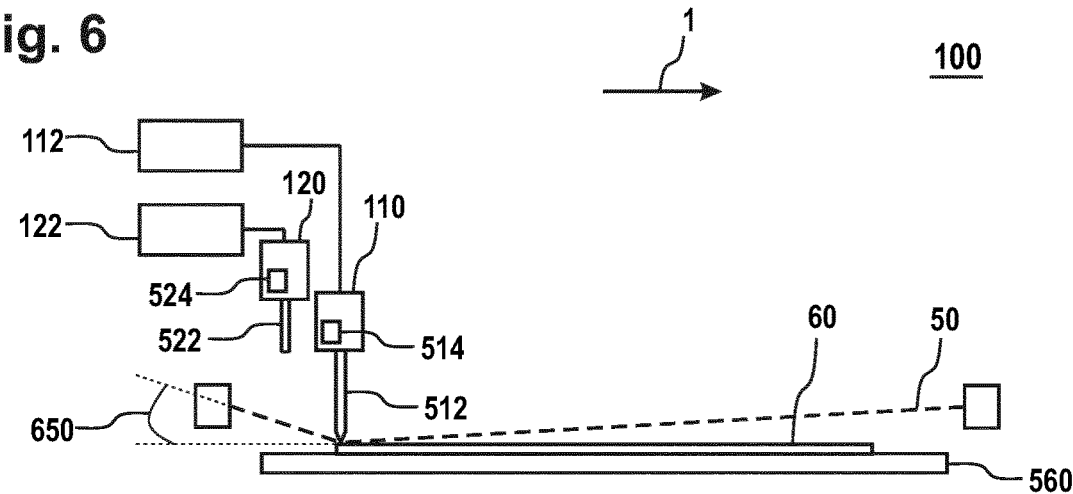

FIG. 6 shows the print head 110 that has been lowered from the position shown in FIG. 5 by the vertical position actuator 514. The position of the print head 110 in FIG. 6 can be understood as the initial position of the printing stroke that will be performed in the first direction 1. The pressure application instrument 512 is in contact with screen 50 and presses the screen downward, resulting in a deflection angle 650 of the screen 50. In light of the fact that the print head is at this time in the initial position at the first end of the screen 50, the deflection angle 650 is relatively large. While the print head 110 is moved downward into the position shown in FIG. 6, the material processing head 120 may stay in the same elevated position as shown in FIG. 5, or, alternatively, may already be lowered towards the screen 50 as well.

Figure 7:
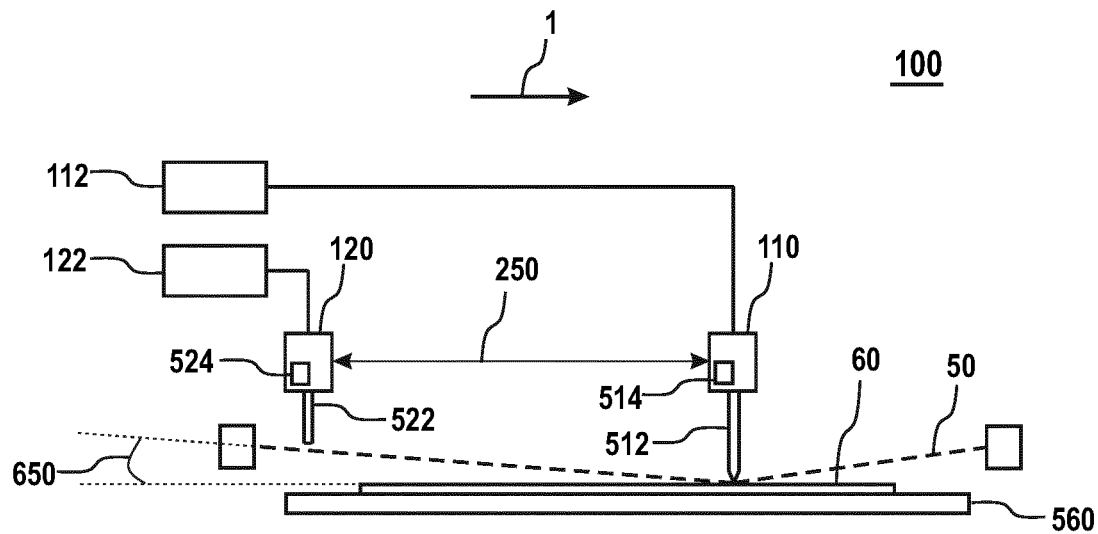

Starting from the initial position of the print head 110 shown in FIG. 6, the first drive actuator 112 may drive the print head 110 in the first direction 1 to a final position to perform a printing stroke. FIG. 7 shows the print head 110 in an intermediate position of the printing stroke, between the initial position and the final position of the printing stroke. When the print head 110 is in the intermediate position, the material processing stroke in the first direction 1 may not have started yet, as shown in FIG. 7. The print head 110 has moved in the first direction, away from the material processing head 120, to increase the separation distance 250. In other words, FIG. 7 illustrates a distance increasing phase as described herein. In the intermediate position of the print head 110, the deflection angle 650 of the screen 50 is smaller than the deflection angle 650 in the initial position of the printing stroke shown in FIG. 6. The screen 50 shown in FIG. 7 is flatter than the screen 50 shown in FIG. 6.

The position of the material processing head 120 shown in FIG. 7 can be understood as the initial position of a material processing stroke, more specifically a flooding stroke, that will be performed by the material processing head 120 in the first direction 1. As compared to the material processing head 120 shown in FIG. 6, the flooder 522 may have been moved downward by the vertical position actuator 524 to a vertical position that is suitable for starting the material processing stroke. In the initial position, the flooder may be slightly above the screen. Starting from the initial position shown in FIG. 7, the second drive actuator 122 may move the material processing head 120 in the first direction 1 to perform the material processing stroke behind the printing stroke. In light of the fact that the separation distance 250 has been increased before the material processing stroke started, the screen 50 may be substantially flat when the material processing stroke starts. The deflection angle 650 will continue to decrease as the print head 110 continues to move in the first direction 1, so that the deflection angle 650 will be small throughout substantially the entire material processing stroke. There may be a need to adapt the vertical position of the flooder during the material processing stroke. The flooder 522 may remain in a substantially constant vertical position during the material processing stroke.

Figure 8:
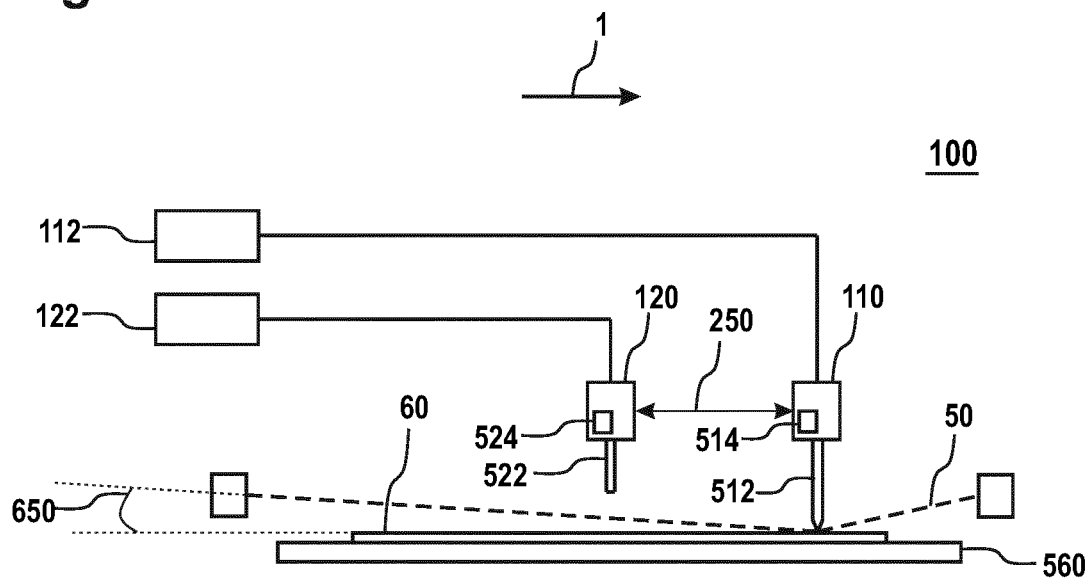

FIG. 8 shows the material processing head 120 in an intermediate position of the material processing stroke, between the initial position and the final position of the material processing stroke. The material processing head 120 is behind the print head 110 with respect to the first direction. The print head 110 performing the printing stroke has reached a position that is closer to the final position of the printing stroke as compared to the intermediate position shown in FIG. 7. The deflection angle 650 has decreased as compared to the deflection angle shown in FIG. 7. The material processing head 120 performing the material processing stroke may move faster than the print head 110 performing the printing stroke so that the separation distance 250 may decrease (distance decreasing phase).

Figure 9:
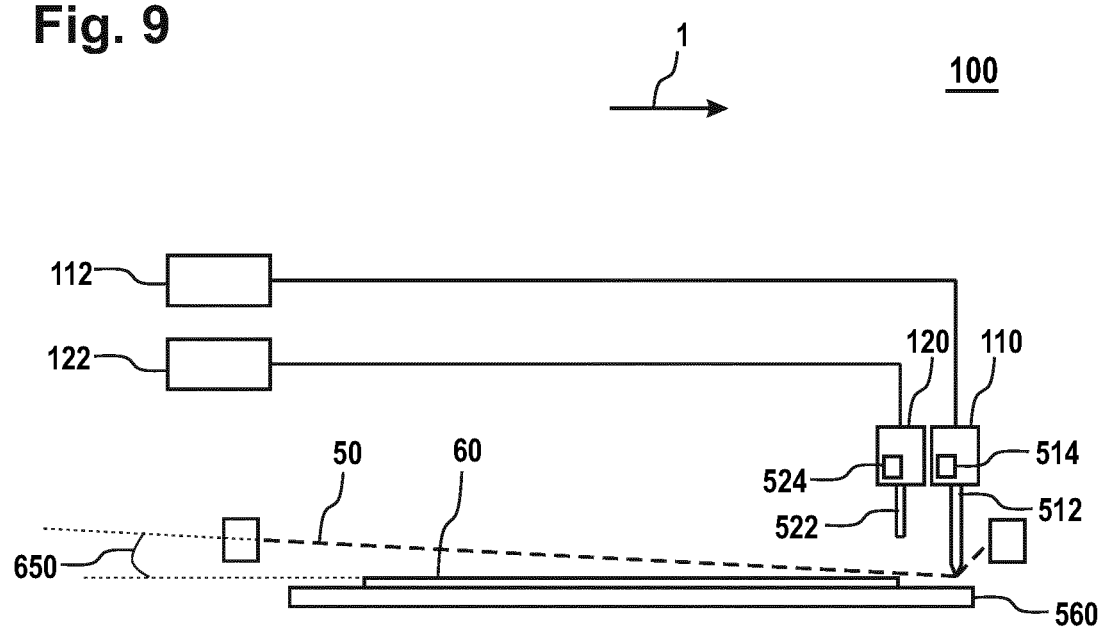

FIG. 9 shows the print head 110 and the material processing head 120 adjacent to each other at the second side of the screen. The print head 110 and the material processing head 120 have traversed the screen 50, specifically the area of the screen corresponding to the substrate 60. The pressure application instrument 512 may still be in contact with the screen 50. The flooder 522 may be in a same vertical position relative to the screen 50 as the vertical position of the flooder 522 during the material processing stroke. In the present example, the position of the print head in FIG. 9 can be understood as the final position of the printing stroke. The position of the material processing head 120 in FIG. 9 can be understood as the final position of the material processing stroke.

Figure 10:
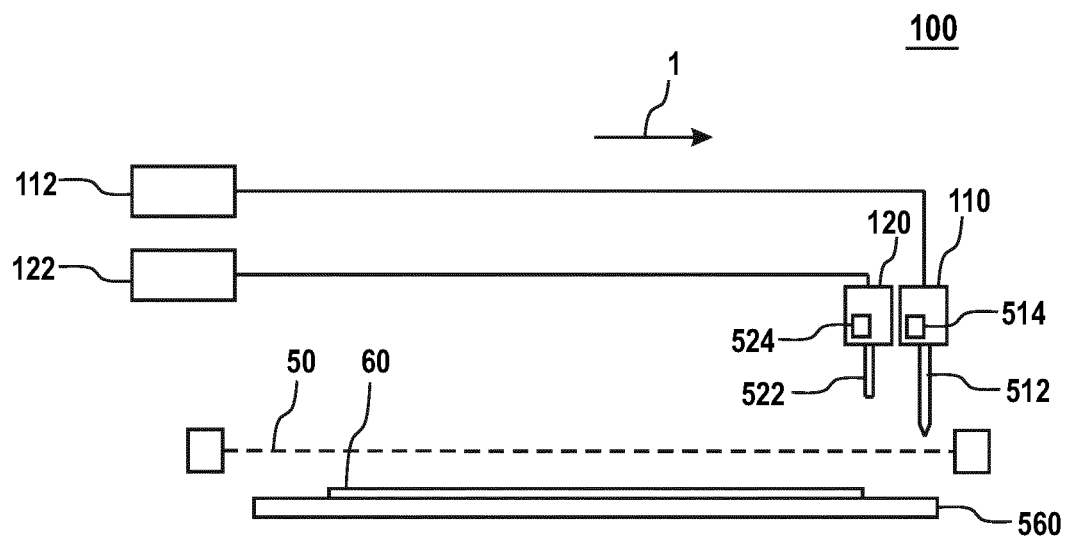

FIG. 10 shows the print head 110 and the material processing head 120 adjacent to each other at the second side of the screen, similar to FIG. 9. The respective vertical positions of the pressure application instrument 512 and the flooder 522 have changed as compared to FIG. 9. The pressure application instrument 512 and the flooder 522 have been lifted upwards to an elevated position above the screen 50. The pressure application instrument 512 does not apply pressure on the screen 50.

The method described herein may include applying a pressure to the screen by a pressure application instrument of the print head to transfer material from the screen to the substrate during at least a portion of the printing stroke. The pressure applied to the screen by the pressure application instrument may result in a deflection of the screen at a screen deflection angle. The screen deflection angle may depend on a position of the pressure application instrument in the first direction. The material processing stroke may start when the pressure application instrument reaches a target position corresponding to a target screen deflection angle. If the material processing stroke starts when the pressure application instrument reaches the target position, the screen deflection angle will be lower than the target screen deflection angle throughout the entire material processing stroke, since the screen deflection angle will continue to decrease as the print head moves towards the final position of the printing stroke.

A vertical position of the material processing head, or a vertical position of a flooder of the material processing head, may be substantially constant during the material processing stroke. The vertical position of the material processing head and/or of the flooder may be a vertical position, or vertical offset, relative to the screen. The term "substantially constant" can be understood in the sense that, throughout the material processing stroke performed by the material processing head from the initial position to the final position of the material processing stroke, the vertical position of the material processing head and/or flooder may be changed by 20% or less, more specifically 10% or less, or may not be changed at all. As described above, the vertical position of the material processing head may remain substantially constant since the material processing stroke may only start when the print head has (almost) reached the other end of the screen, so that the screen is substantially flat throughout the entire material processing stroke.

The printing stroke and the material processing stroke that are performed in the first direction 1, as described above, may be referred to as a first printing stroke and a first material processing stroke, respectively. The material processing head 120 may be referred to as a first material processing head. Embodiments described herein may involve performing a second printing stroke and a second flood stroke in a second direction opposite to the first direction 1. The second printing stroke may be performed by the print head 110 after the first printing stroke. The second material processing stroke may be performed by a second material processing head different from the material processing head 120, after the first material processing stroke. The second direction may be a substantially horizontal direction, like the first direction.

FIGS. 11-20 illustrate a method of performing screen printing on a substrate used for the manufacture of a solar cell according to embodiments described herein. FIGS. 11-20 are provided in chronological order.

As shown in FIGS. 11-20, in addition to a material processing head 120 and a print head 110, the apparatus 100 may include a material processing head 1120, i.e. a second material processing head. The material processing head 1120 may be configured for performing a second material processing stroke in a second direction 2 opposite to the first direction 1. The material processing head 1120 may be connected to a third drive actuator 1122 of the apparatus 100. The third drive actuator 1122 may be configured to move, or drive, the material processing head 1120 in the second direction 2 to perform the second material processing stroke. The third drive actuator 1122 may, for example, include a stepper motor, a linear motor, a brushless motor, such as a brushless motor combined with timing-belt linear transmission or a brushless motor combined with screw/nut linear transmission, or any combination thereof. The third drive actuator 1122 may be connected to a controller as described herein. The first drive actuator 112, the second drive actuator 122 and the third drive actuator 1122 may be individually controllable, or independent, actuators. The material processing head 1120 may include similar parts as the material processing head 120. For example, the material processing head may include a flooder and/or a vertical positioning actuator.

Figure 11:
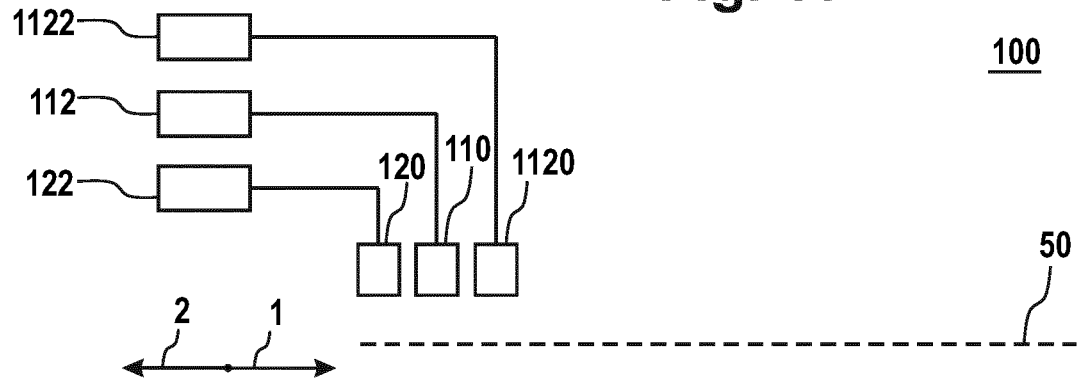
FIGS. 11-20 illustrate a method of performing screen printing on a substrate used for the manufacture of a solar cell, wherein a first printing stroke and a first material processing stroke are performed in a first direction, and wherein a second printing stroke and a second material processing stroke are performed in a second direction.

FIG. 11 shows the print head 110, the material processing head 120 and the material processing head 1120 in an elevated position above the screen 50 at a first side of the screen 50, before the first printing stroke is started. The material processing head 120 and the material processing head 1120 are on opposite sides of the print head 110.

Figure 12:
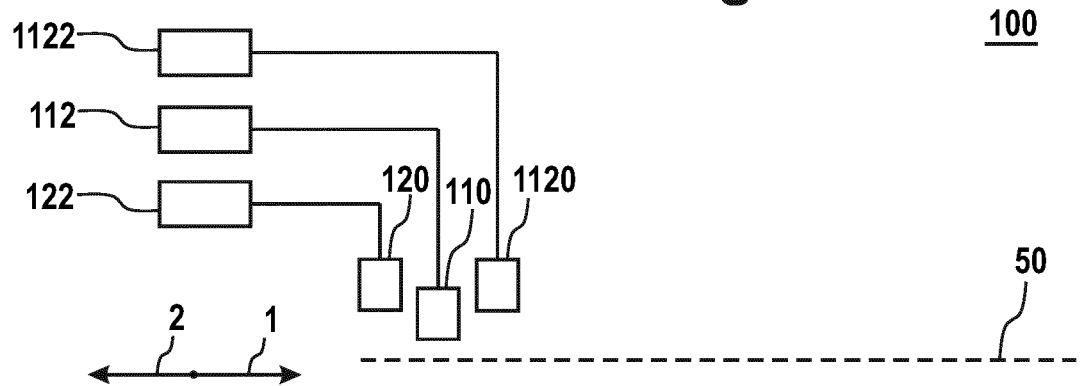

FIG. 12 shows the print head 110 in a lowered position while the material processing head 120 and the material processing head 1120 may still be in an elevated position. A pressure application instrument (not shown) of the print head 110 may exert a pressure on the screen 50. The position of the print head 110 shown in FIG. 12 may be the initial position of the first printing stroke, i.e. the printing stroke in the first direction 1.

Starting from the position of the print head 110 shown in FIG. 12, the first drive actuator 112 may move the print head 110 in the first direction 1 to perform the first printing stroke. During the first printing stroke, the material processing head 1120 may be moved together with the print head 110 in the first direction 1, wherein the print head 110 may be moved by the first drive actuator 112 and the material processing head 1120 may be moved by the third drive actuator 1122. The material processing head 1120 may be in front of the print head 110 while the first printing stroke is performed. The term "in front of" can, in the context of the movements that are performed in the first direction 1, be understood in the sense that the material processing head 1120 precedes the print head 110 with respect to the first direction 1. During the movement of the material processing head 1120 in the first direction 1, the material processing head 1120 may remain in an elevated position above the screen 50 without performing a material processing operation. The movement of the material processing head 1120 in the first direction 1 may be a transportation of the material processing head 1120 in a non-operational state. The movement of the material processing head 1120 in the first direction 1 may not be not a material processing stroke.

Figure 13:
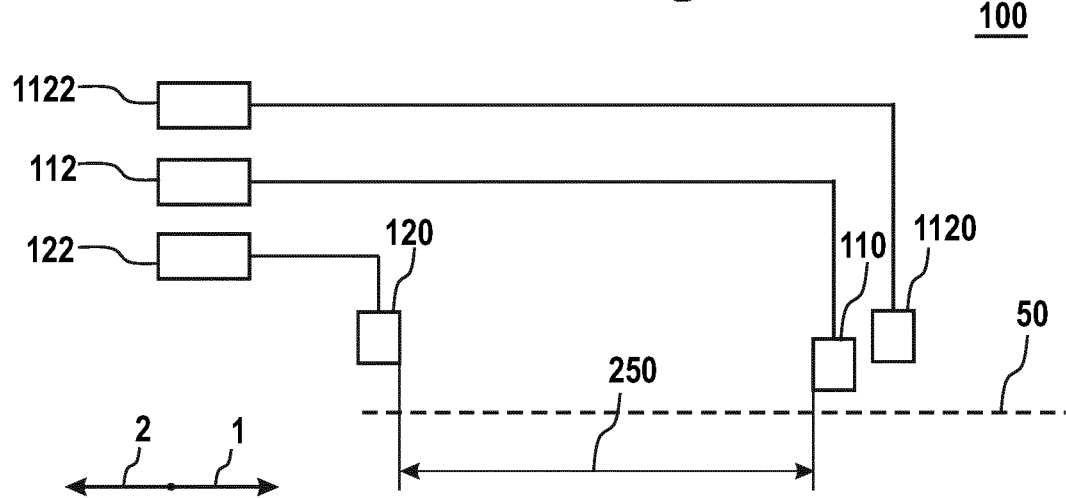
Figure 14:
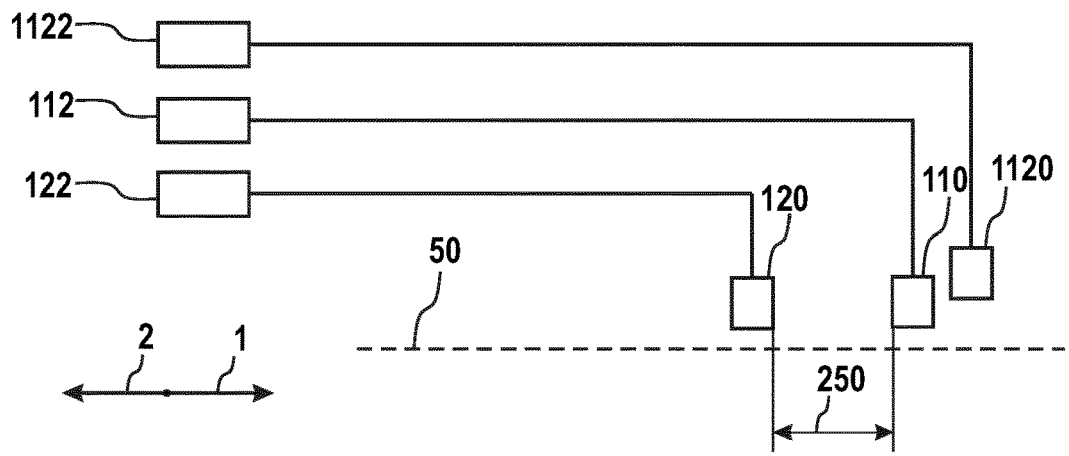
Figure 15:
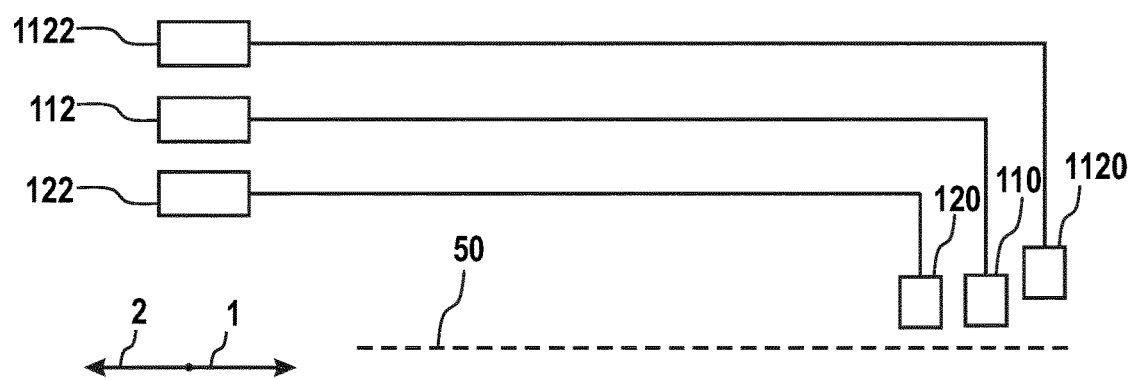

The print head 110 may perform a first printing stroke in the first direction 1 and the material processing head 120 may perform a first material processing stroke in the first direction 1 in the manner as described above, including a distance increasing phase and a distance decreasing phase. The aspects relating to the first printing stroke and the first material processing stroke as described above are also applicable to the operations illustrated in FIGS. 12-15 and will not be repeated in detail. In brief, FIG. 13 illustrates a distance increasing phase of the first printing stroke. FIG. 14 illustrates a distance decreasing phase of the first material processing stroke. FIG. 15 shows the print head 110 and the material processing head 120 in the final position of the first printing stroke and the final position of the first material processing stroke, respectively.

During substantially the entire first printing stroke and/or during substantially the entire first material processing stroke, the material processing head 1120 may be in front of the print head 110, as shown in FIGS. 12-15. During substantially the entire first printing stroke and/or during substantially the entire first material processing stroke, the print head 110 may be adjacent to the material processing head 1120. The distance in the first direction between the print head 110 and the material processing head 1120 may be constant during the first printing stroke and/or during the first material processing stroke.

Figure 16:
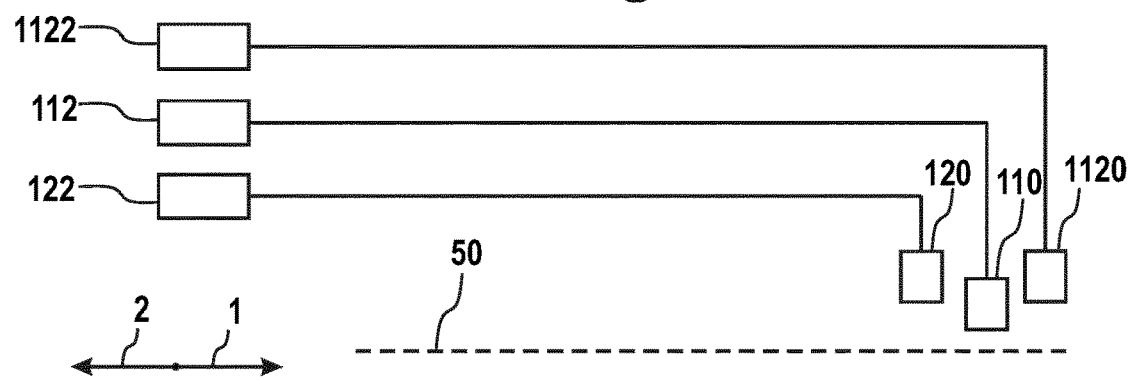

After the first printing stroke has ended and/or after the first material processing stroke has ended, the first drive actuator 112 may move the print head 110 to perform a second printing stroke in the second direction 2. The first drive actuator 112 may move the print head 110 from an initial position of the second printing stroke at the second side of the screen to a final position of the second printing stroke at the first side of the screen. FIG. 16 illustrates the initial position of the second printing stroke. The print head 110 has been lowered so that the pressure application instrument (not shown) of the print head 110 applies a pressure to the screen 50. The material processing head 120 is in an elevated position, i.e. in a non-operational state. During the second printing stroke, the material processing head 120 may be moved together with the print head 110 in the second direction 2, wherein the print head 110 may be moved by the first drive actuator 112 and the material processing head 120 may be moved by the second drive actuator 122. During the second printing stroke, the material processing head 120 may be in front of the print head 110 in a non-operational state. The term "in front of" can, in the context of the movements that are performed in the second direction 2, be understood in the sense that the material processing head 120 precedes the print head 110 with respect to the second direction 2.

After the first printing stroke has ended and/or after the first material processing stroke has ended, the third drive actuator 1122 may move the material processing head 1120 to perform a second material processing stroke in the second direction 2. The third drive actuator 1122 may move the material processing head 1120 from an initial position of the second material processing stroke at the second side of the screen to a final position of the second material processing stroke at the first side of the screen. The second material processing stroke may be performed behind the second printing stroke. The term "behind" can, in the context of the movements in the second direction 2, be understood in the sense that, during the entire second material processing stroke, the print head 110 is ahead of the material processing head 1120 with respect to the second direction 2. In FIGS. 17-20, the material processing head 1120 is behind the print head 110 with respect to the second direction 2.

FIGS. 17-20 illustrate the second printing stroke and the second material processing stroke. The aspects described above in relation to the first printing stroke and the first material processing stroke also apply to the second printing stroke and the second material processing stroke, respectively, apart from the fact that the latter strokes are performed in the second direction 2 instead of the first direction 1.

Figure 17:
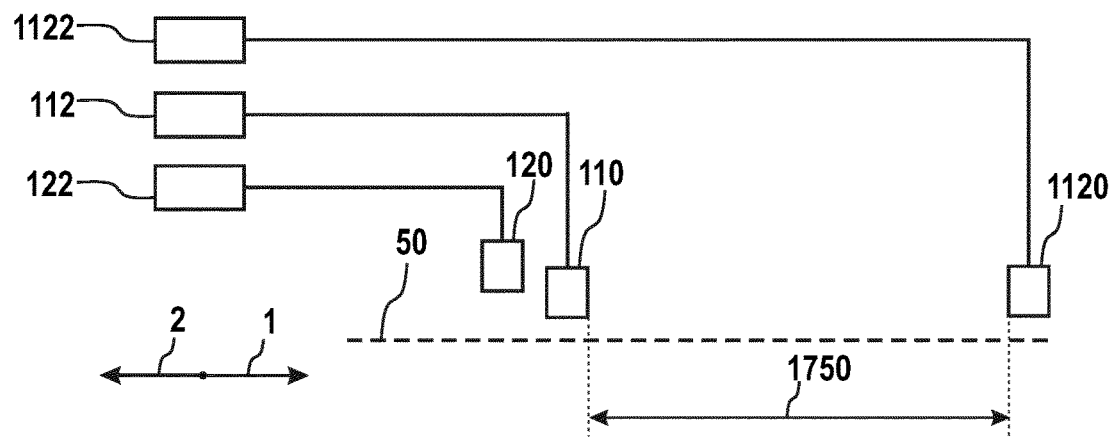

FIG. 17 illustrates a distance increasing phase of the second printing stroke. A separation distance 1750 between the print head 110 and the material processing head 1120 may be increased by moving the print head 110 away from the material processing head 1120 in the second direction 2, for example before the second material processing stroke has started. The position of the material processing head 1120 shown in FIG. 17 can be understood as the initial position of the second material processing stroke.

Figure 18:
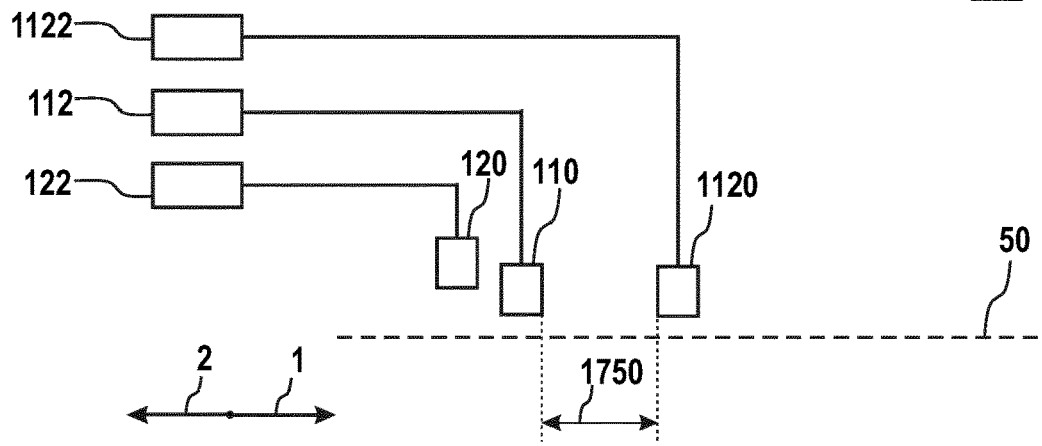

FIG. 18 illustrates a distance decreasing phase of the second material processing stroke. The separation distance 1750 may be decreased by moving the material processing head 1120 towards the print head 110 in the second direction 2.

Figure 19:
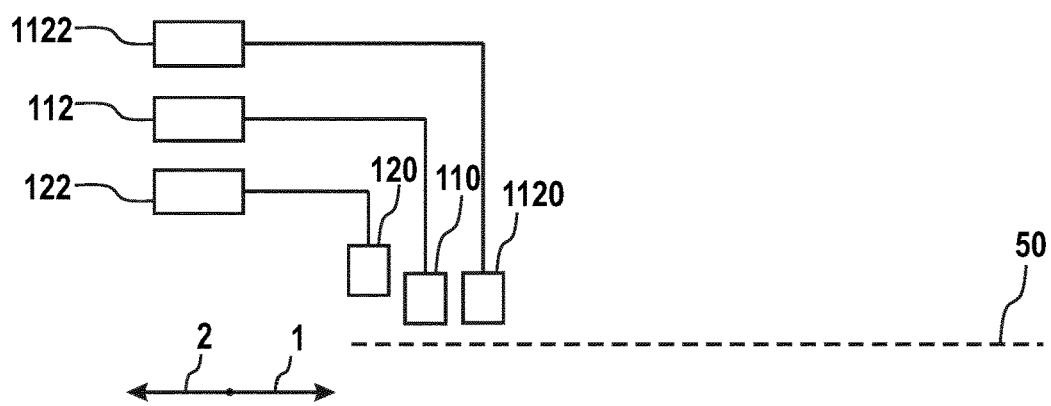

FIG. 19 shows the print head 110 and the material processing head 1120 in the final position of the second printing stroke and the final position of the second material processing stroke, respectively, at the first side of the screen 50.

Figure 20:
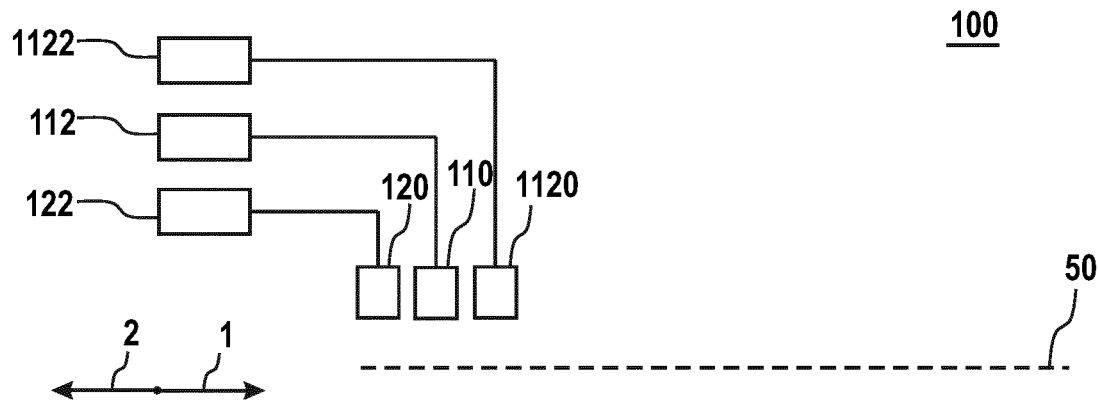

FIG. 20 shows the print head 110, the material processing head 120 and the material processing head 1120 in an elevated position at the first side of the screen 50, after the second printing stroke and the second material processing stroke have been performed.

The aspects described in relation to FIGS. 1-4, the aspects described in relation to FIGS. 5-10, and the aspects described in relation to FIGS. 11-20 can be combined with each other.

The method described herein may include reversing the movement of the print head after the first printing stroke has ended to perform a second printing stroke in a second direction opposite to the first direction. The first material processing stroke may start before said reversing of the movement of the print head.

The method described herein may include moving the print head in a second direction opposite to the first direction to perform a second printing stroke. The method may include moving a second material processing head (e.g. material processing head 1120) by a third drive actuator to perform a second material processing stroke in the second direction. The second material processing stroke may be performed behind the second printing stroke (with respect to the second direction). The print head may be moved away from the second material processing head by the first drive actuator during a distance increasing phase of the second printing stroke to increase a separation distance between the print head and the second material processing head.

The print head may be moved by the first drive actuator from an initial position of the second printing stroke at the second side of the screen to a final position of the second printing stroke at the first side of the screen to perform the second printing stroke. The initial position of the second printing stroke may be adjacent or even equal to the final position of the first printing stroke. The second material processing head may be moved by the third drive actuator from an initial position of the second material processing stroke at the second side of the screen to a final position of the second material processing stroke at the first side of the screen to perform the second material processing stroke. The initial position of the second material processing stroke may be adjacent or even equal to the final position of the first material processing stroke.

The second material processing head may be substantially stationary with respect to the second direction during the distance increasing phase of the second printing stroke.

The second material processing stroke may start after the second printing stroke has started and/or before the second printing stroke has ended. The first material processing stroke may start before the second printing stroke as started.

The method described herein may include moving the second material processing head toward the print head by the third drive actuator during a distance decreasing phase of the second material processing stroke to decrease the separation distance between the print head and the second material processing head. The distance decreasing phase of the second material processing stroke may be performed after the distance increasing phase of the second printing stroke. At least part of the distance decreasing phase of the second material processing stroke may be performed while the print head performs the second printing stroke. The distance decreasing phase of the second material processing stroke may be performed directly after the distance increasing phase of the second printing stroke.

An average stroke speed of the second material processing head during the second material processing stroke may be higher than an average stroke speed of the print head during the second printing stroke, so that a duration of the second material processing stroke is shorter than a duration of the second printing stroke.

A vertical position of the second material processing head during the second material processing stroke may be substantially constant.

The print head may be moved in the second direction from an initial position of the second printing stroke to a final position of the second printing stroke, the final position being spaced apart from the initial position by a total stroke distance of the second printing stroke. A maximum separation distance between the print head and the second material processing head reached during the second printing stroke may be 50% or more, 70% or more or even 90% or more of the total stroke distance of the second printing stroke. The second material processing stroke may start when the print head reaches a target position. The target position may be spaced apart from the initial position of the second printing stroke by 50% or more, 70% or more or even 90% of the total stroke distance of the second printing stroke. The target position may substantially correspond to a position of a second edge of the substrate or a second edge of the substrate receiving region.

The method described herein may include applying a pressure to the screen by the pressure application instrument of the print head to transfer material from the screen to the substrate during at least a portion of the second printing stroke. The pressure applied to the screen by the pressure application instrument may result in a deflection of the screen at a screen deflection angle, the screen deflection angle depending on a position of the pressure application instrument in the second direction. The second material processing stroke may start when the pressure application instrument reaches a target position corresponding to a target screen deflection angle.

Figure 21:
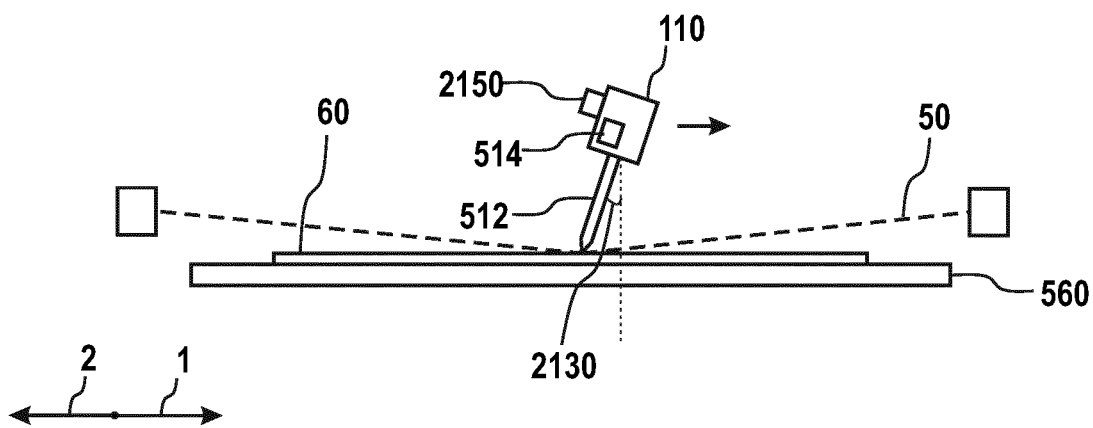
FIGS. 21-25 illustrate an adjustment of an inclination angle of a pressure application instrument of the print head.

FIG. 21 shows the print head 110 during the first printing stroke in the first direction 1. The pressure application instrument 512 of the print head 110 applies a pressure to the screen 50 to transfer deposition material from the screen 50 to the substrate 60. The print head 110 may include, or be connected to, an actuator arrangement 2150 connected to the pressure application instrument 512. The actuator arrangement 2150 may be configured to adjust an inclination angle 2130 of the pressure application instrument 512. The actuator arrangement 2150 may include one or more linear motors and/or a torque motor to adjust the inclination angle 2130.

The inclination angle 2130 of the pressure application instrument 512 can be understood as an inclination angle with respect to a reference axis (or reference plane), for example a vertical reference axis as indicated in FIG. 21.

The inclination angle 2130 can be an angle of a principal axis (or principal plane) of the pressure application instrument 512 with respect to the reference axis. The inclination angle 2130 may result from rotating the pressure application instrument 512 with respect to a substantially horizontal rotation axis. The term "substantially horizontal" can include deviations of up to 5% or even 10% from an exactly horizontal direction. In FIG. 21, the substantially horizontal rotation axis may be perpendicular to the drawing plane. The specific inclination angle 2130 shown in FIG. 21 can be understood as a positive angle.

The inclination angle 2130 may be 55° or less with respect to a vertical reference axis, specifically 30° or less, more specifically 20° or less. As an example, the inclination angle 2130 may be from 20 to 55°.

The actuator arrangement 2150 may adjust the inclination angle 2130 by rotating the entire print head 110 or by rotating only a portion of the print head 110. The actuator arrangement 2150 may be configured to adjust the inclination angle 2130 to control an angle of an active surface of the pressure application instrument 512 relative to the screen 50 during the printing stroke. The active surface may be a surface of the pressure application instrument 512, for example a side surface of a squeegee, that is tilted and in contact with the deposition material on the screen 50 during the printing stroke. During the printing stroke, the active surface may exert a pressure on the deposition material disposed on the screen 50 so that the deposition material is urged through the screen 50.

Figure 22:
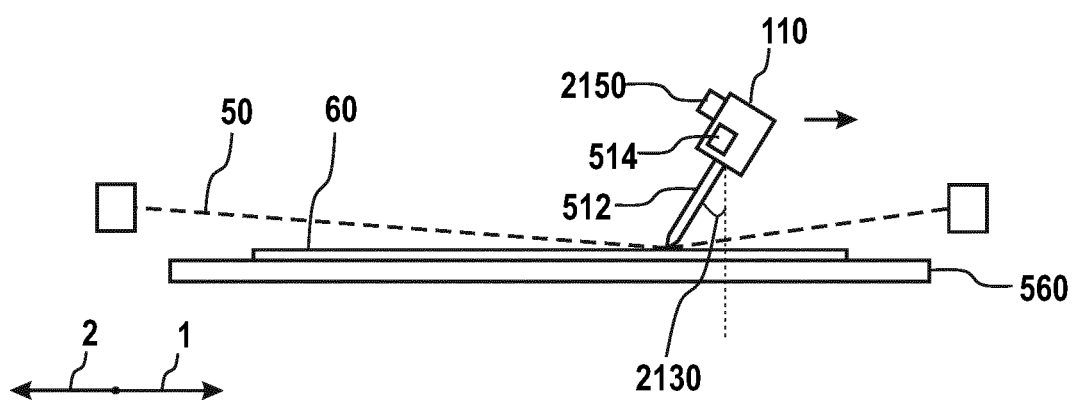

The actuator arrangement 2150 may be connected to a controller as described herein. The controller may control the inclination angle 2130 during a printing stroke, such as the first printing stroke illustrated in FIG. 21. The inclination angle 2130 may be controlled in real time during a printing stroke. The controller may instruct the actuator arrangement 2150 to adjust the inclination angle 2130 during the printing stroke. FIG. 21 shows the print head 110 in a first position along the first direction 1, during the first printing stroke. FIG. 22 shows the print head 110 at a later time during the first printing stroke, so that the print head 110 has reached a second position further ahead of the first position shown in FIG. 21. The inclination angle 2130 shown in FIG. 22 is different from the inclination angle 2130 shown in FIG. 21. The controller may adjust the inclination angle 2130 during the first printing stroke.

Embodiments described herein provide for an actuator arrangement 2150 to adjust the inclination angle 2130. As compared to a system where the inclination angle 2130 is adjusted manually, an improved flexibility is provided. In particular, having an actuator arrangement 2150 allows controlling the inclination angle 2130 in real time during a printing stroke. Controlling the inclination angle 2130 during a printing stroke can improve the quality of the layer printed on the substrate, more specifically the precision with which the layer is printed. For example, a printing stroke may be configured for printing one or more conductive lines, or fingers, on a solar cell. A finger may have a tapered shape that is thicker at a proximal portion of the finger and thinner towards a distal portion of the finger, so that less deposition material is needed for printing the distal portion of the finger. By controlling the inclination angle 2130 during the printing stroke, the pressure (hydrodynamic pressure) applied by the active surface to the deposition material on the screen can be controlled, particularly said pressure can be gradually reduced when moving from the proximal portion of the finger to the distal portion of a finger. An improved control of the deposition can be provided.

Figure 23:
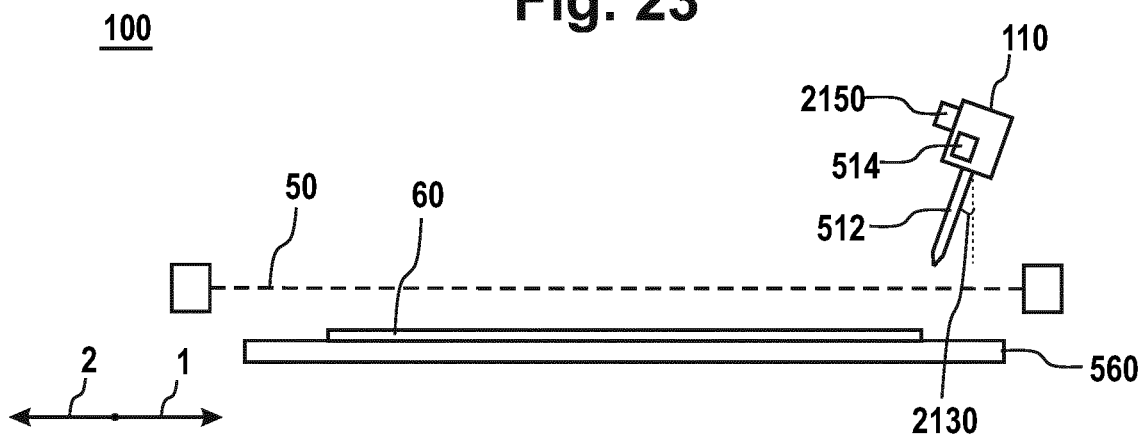
Figure 24:
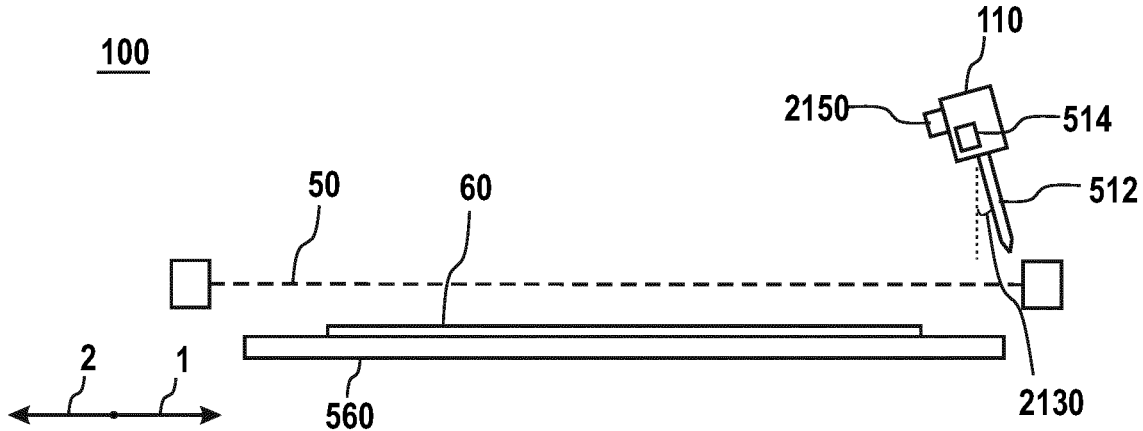

FIGS. 23-24 show the print head 110 after the first printing stroke has ended and before the second printing stroke has started. The pressure application instrument 512 is at an elevated position above the screen 50. During the period between the two printing strokes, the inclination angle of the pressure application instrument 512 may be changed, by the actuator arrangement 2150, from a positive angle to a negative angle (or, in other examples, from a negative angle to a positive angle). FIG. 23 shows the inclination angle 2130 as a positive angle, directly after the first printing stroke has ended. FIG. 24 shows the inclination angle 2130 as a negative angle, after the inclination angle 2130 has been changed from the positive angle of FIG. 23 into a negative angle. FIGS. 23-24 illustrate an adjustment of the inclination angle 2130 while the pressure application instrument 512 is elevated above the screen 50. In other implementations, the angle adjustment may be performed while the pressure application instrument 512 maintains contact with the screen 50. The latter approach may decrease cycle time.

Figure 25:
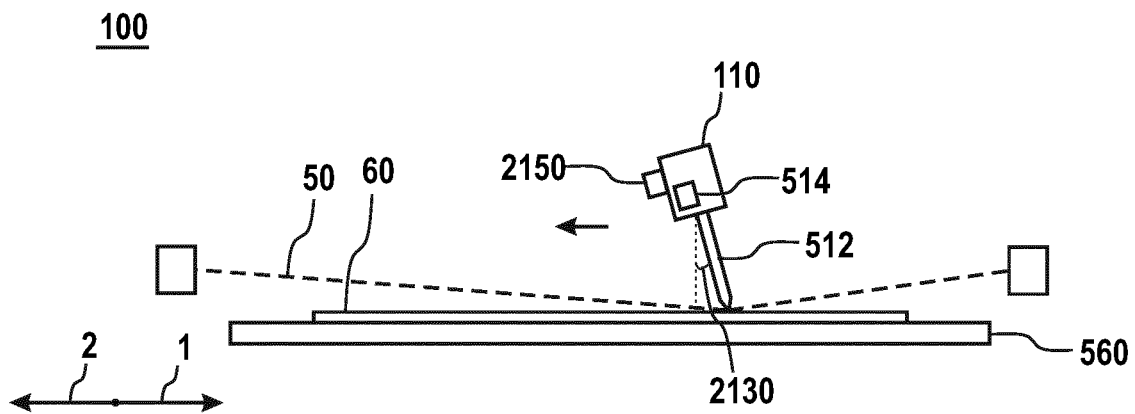

FIG. 25 shows the print head 110 during the second printing stroke in the second direction 2, after the situation depicted in FIG. 24. The pressure application instrument 512 applies a pressure to the screen 50 to transfer deposition material from the screen 50 to the substrate 60. The inclination angle 2130 is negative. The inclination angle 2130 may be controlled during the second printing stroke, by way of the controller that instructs the actuator arrangement 2150. During the second printing stroke, the inclination angle 2130 may be adjusted by the actuator arrangement 2150 from a first negative angle to a second negative angle.

As described above, adjusting the inclination angle 2130 allows controlling an angle of an active surface of the pressure application instrument 512 with respect to the screen 50 during a printing stroke. The active surface during the first printing stroke (wherein the inclination angle 2130 may, for example, be positive) may be different from the active surface during the second printing stroke (wherein the inclination angle 2130 may, for example, be negative). The active surface during the first printing stroke may be a first surface, e.g. side surface, of a first squeegee. The active surface during the second printing stroke may be a second surface of the first squeegee opposite the first surface, e.g. an opposing side surface of the same squeegee, or may be a second surface of a second squeegee different from the first squeegee, in case the pressure application instrument includes two squeegees.

The terms "positive angle" and "negative angle" used with reference to the figures are merely coined for the sake of concreteness and the disclosure shall not be limited thereto. For example, the inclination angle 2130 shown in FIGS. 21-23 and the inclination angle 2130 shown in FIGS. 24-25 may also be called "negative" and "positive", respectively. The terminology of positive versus negative angles is used herein to denote angles having opposite orientations, irrespective of which orientation is called "positive" and which orientation is called "negative".

For ease of presentation, the material processing heads 120 and 1120 are not shown in FIGS. 21-25. The material processing head 120 and/or the material processing head 1120 may also be present.

Figure 26:
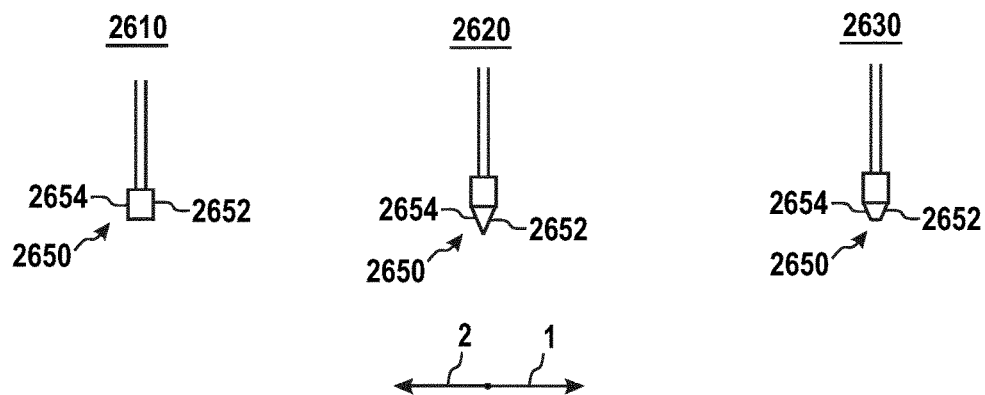
FIG. 26 shows different examples of squeegees.

The pressure application instrument may be inclined at an inclination angle when applying pressure to the screen. The method described herein may include controlling the inclination angle of the pressure application instrument during at least a portion of the first printing stroke and/or during at least a portion of the second printing stroke. The inclination angle of the pressure application instrument may be positive during at least a portion of the first printing stroke. The method may include performing an angular movement of the pressure application instrument to change the inclination angle from a positive angle to a negative angle. The method may include applying a pressure to the screen by the pressure application instrument to transfer material from the screen to the substrate at a negative inclination angle of the pressure application instrument during at least a portion of the second printing stroke FIG. 26 shows three examples of a squeegee. A squeegee may have an end portion 2650. The end portion 2650 may be configured to be in contact with the deposition material on the screen. The end portion 2650 may be configured to apply a pressure to the deposition material on the screen to urge the deposition material through the screen. The squeegees shown in FIG. 26 are double-sided squeegees. A double-sided squeegee can be understood as a squeegee configured to perform printing strokes in two opposing directions, such as the first direction 1 and the second direction 2. The end portion 2650 may have a first side surface 2652 and a second side surface 2654 opposite the first side surface 2652. The first side surface 2652 may be an active surface during a printing stroke in the first direction 1. The second side surface 2654 may be an active side surface during a printing stroke in the second direction 2.

In FIG. 26, the squeegee 2610 on the left has an end portion 2650 with a rectangular shape. The first side surface 2652 and the second side surface 2654 are parallel surfaces. The squeegee 2620 in the middle and the squeegee 2630 on the right both have an end portion 2650 with a tapered shape. The first side surface 2652 is at an angle with respect to the second side surface 2654. The squeegee 2620 has a first side surface and a second side surface that meet each other in a joint edge of the first side surface and the second side surface, providing a sharp tip. The squeegee 2630 has an end portion having a chamfered tip. A bottom surface joins the first side surface 2652 and the second side surface 2654.

A rectangular end portion 2650, as shown in the squeegee 2610, has the advantage that the first side surface 2652 and the second side surface 2654 are spaced apart from each other across the entire length of the first side surface 2652 and second side surface 2654. Accordingly, there is a body of material separating the first side surface 2652 from the second side surface 2654 across said lengths. A robust end portion is provided that allows to easily control the amount of pressure that is applied to the deposition material by the squeegee. Further, as compared to a tapered end portion, a rectangular end portion is less subject to wear.

A tapered end portion 2650, as shown in the squeegees 2620 and 2630, has the advantage that the active surface is inclined with respect to the screen even when the squeegee is in a vertical orientation. In applications where a relatively large angle of the active surface with respect to the screen is targeted, an inclination angle 2130 over which the pressure application instrument 512 shall additionally be rotated (by the actuator arrangement 2150 as described herein) can be kept small, since the active surface is already inclined with respect to the screen by the tapered design of the end portion.

Figure 27:
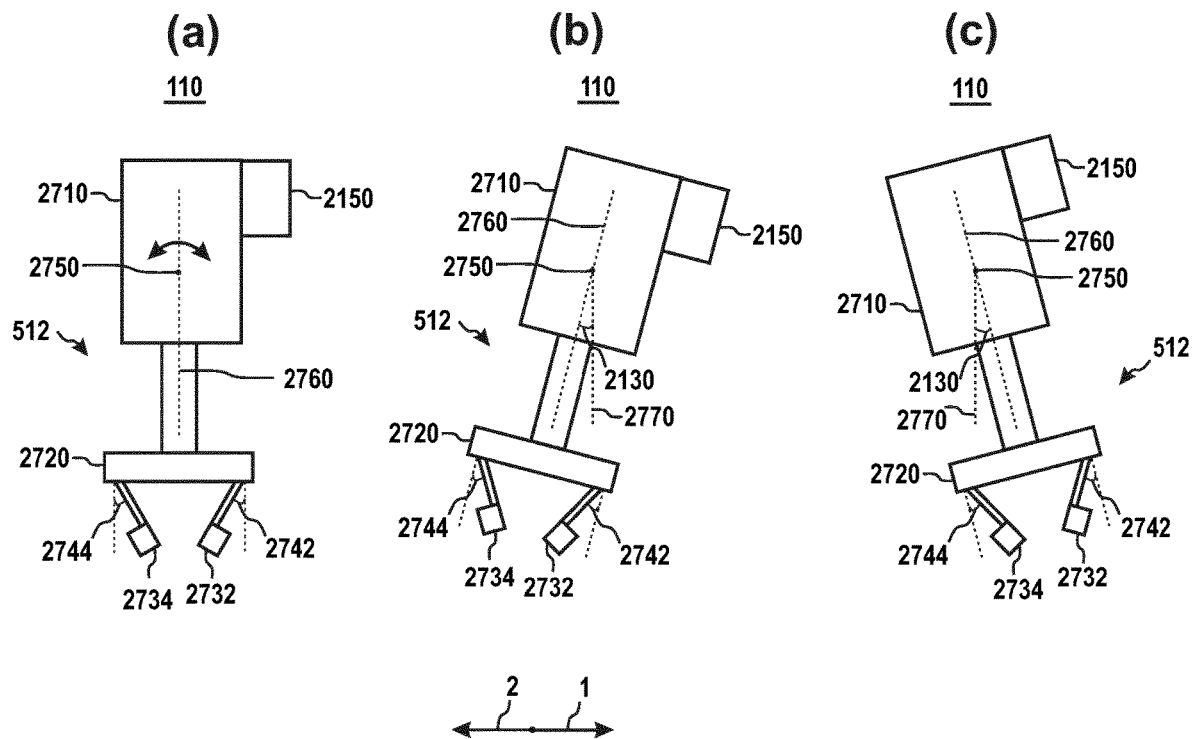
FIG. 27 shows an example of a print head including two squeegees in an inclined orientation, the print head being rotatable around a rotation axis.

FIG. 27 shows an example of a print head 110 as described herein. As shown in FIG. 27, the pressure application instrument 512 may include a first squeegee 2732 and a second squeegee 2734. The first squeegee 2732 and the second squeegee 2734 may have rectangular end portions. The first squeegee 2732 and the second squeegee 2734 may be single-sided squeegees. A single-sided squeegee can be understood as a squeegee configured for performing a printing stroke in a single direction. A single-sided squeegee may have a single active surface for performing a printing operation. The first squeegee 2732 may be configured to perform a printing stroke in the first direction 1. The second squeegee 2734 may be configured to perform a printing stroke in the second direction 2. The first squeegee 2732 and the second squeegee 2734 may be mounted to a support 2720. The support 2720 may be connected to a body portion 2710 of the print head 110. The pressure application instrument 512 may have a principal axis 2760 (or principal plane). The first squeegee 2732 may be inclined at a first angle 2742 with respect to the principal axis 2760. The second squeegee 2734 may be inclined at a second angle 2744 with respect to the principal axis 2760. The first angle 2742 and/or the second angle 2744 may be fixed angles, e.g. angles provided by attaching the first squeegee 2732 and/or the second squeegee 2734 to the support 2720 in a fixed angular orientation. The first squeegee 2732 and the second squeegee 2734 may be inclined with respect to each other. The end portions of the first squeegee 2732 and the second squeegee 2734 may be inclined towards each other.

As shown in FIG. 27, the print head 110 may have a rotation axis 2750. The principal axis 2760 may be perpendicular to the rotation axis 2750 and/or may intersect with the rotation axis 2750. The rotation axis 2750 may be disposed in the body portion 2710 of the print head 110. The rotation axis 2750 may be disposed above the first squeegee 2732 and the second squeegee 2734 and/or above the support 2720. The print head 110 may be rotatable with respect to the rotation axis 2750 by the actuator arrangement 2150 to adjust the inclination angle of the pressure application instrument, more specifically to adjust the inclination angles of the first squeegee 2732 and/or the second squeegee 2734. The actuator arrangement 2150 may be mounted to the body portion 2710 of the print head 110. The actuator arrangement 2150 may be configured for rotating the entire print head 110. The first squeegee 2732, the second squeegee 2734, the support 2720, and the body portion 2710 may be configured to rotate together with respect to the rotation axis 2750. The actuator arrangement 2150 may include a torque motor or one or more linear motors.

FIG. 27(a) shows the print head 110 in a vertical orientation. The principal axis 2760 extends vertically (or substantially vertically, with a deviation of e.g. about 10 degrees or less). The inclination angle of the pressure application instrument 512 is zero.

FIGS. 27(b-c) show the print head 110 in inclined orientations. An inclination angle 2130 between the principal axis 2760 (or principal plane) and a vertical reference axis 2770 (or vertical reference plane) is provided. In FIG. 27(b), the inclination angle 2130 is positive, as may be the case during a printing stroke in the first direction 1. With a positive inclination angle 2130, the first squeegee 2732 may perform a printing operation during a printing stroke in the first direction 1. The total inclination angle of an active surface of the first squeegee 2732 may be determined by, or equal to, the sum of the inclination angle 2130 and the first angle 2742. In FIG. 27(c), the inclination angle 2130 is negative, as may be the case during a printing stroke in the second direction 2. With a negative inclination angle 2130, the second squeegee 2734 may perform a printing operation during a printing stroke in the second direction 2. The total inclination angle of an active surface of the second squeegee 2734 may be determined by, or equal to, the sum of the inclination angle 2130 and the second angle 2744.

An advantage of the print head 110 shown in FIG. 27 is that the two squeegees are mounted to the support 2720 in a tilted orientation (cf. the first angle 2742 and the second angle 2744). In applications where a relatively large angle of the active surface of the pressure application instrument 512 with respect to the screen is targeted, an inclination angle 2130 over which the pressure application instrument 512 shall additionally be rotated can be kept small, since the active surface is already inclined with respect to the screen due to the tilted arrangement of the squeegees. At the same time, squeegees with rectangular end portions can be used, providing the advantages thereof as described above. A further advantage is that the rotation axis 2750 is relatively close to the screen i.e. the vertical distance from the rotation axis 2750 to the screen is small. Accordingly, when rotating the print head 110 around the rotation axis 2750 to change the inclination angle 2130, the horizontal distance over which the squeegees are displaced, as a side-effect of the rotation, is small. An additional horizontal translation of the print head to compensate for said displacement can be kept small.

A pressure application instrument as described herein may include a first squeegee and a second squeegee that may each have a rectangular end portion. The first squeegee and the second squeegee may be mounted to a portion of the print head in an inclined orientation relative to each other. The method described herein may include performing a first printing operation during the first printing stroke by the first squeegee, wherein an inclination angle of the pressure application instrument is positive. The method may include adjusting the inclination angle of the pressure application instrument from a positive angle to a negative angle by an actuator arrangement. The inclination angle may be adjusted by rotating at least a portion of the print head with respect to a rotation axis that may be disposed above the first squeegee and the second squeegee. The method may include performing a second printing operation during the second printing stroke by the second squeegee, wherein the inclination angle of the pressure application instrument is negative.

FIGS. 28-29 show an example of a print head 110 in a front view and a side view, respectively. The pressure application instrument 512 may include a squeegee 2830. The squeegee 2830 may be the only squeegee of the pressure application instrument 512, particularly the only squeegee of the print head 110. The squeegee 2830 may have a rectangular end portion. The squeegee 2830 may be mounted to a rotatable support 2820. The rotatable support 2820 may be rotatably connected to a body portion 2810 of the print head 110. The rotatable support 2820 may have a rotation axis 2850. The rotatable support 2820 may be rotatable about the rotation axis 2850 to adjust an inclination angle of the squeegee 2830. The rotation axis 2850 may extend through the rotatable support 2820 and/or through the squeegee 2830. The rotatable support 2820 may be rotatable relative to the body portion 2810. The rotatable support 2820 may be rotated by an actuator arrangement 2150. The actuator arrangement 2150 may include a torque motor.

The pressure application instrument 512 may have a principal axis 2860 (or principal plane). The principal axis 2860 may extend in a length direction of the squeegee 2830, as shown in FIG. 28. The principal axis 2860 may be perpendicular to the rotation axis 2850 and/or may intersect with the rotation axis 2850.

FIG. 28(*a*) shows the print head 110 in a vertical orientation. The principal axis 2860 extends vertically (or substantially vertically). The inclination angle of the pressure application instrument 512 is zero.

FIGS. 28(*b-c*) show the print head 110 in inclined orientations. An inclination angle 2130 between the principal axis 2860 and a vertical reference axis 2870 (or vertical reference plane) is provided. In FIG. 28(*b*), the inclination angle 2130 is positive, as may be the case during a printing stroke performed by the squeegee 2830 in the first direction 1. In FIG. 28(*c*), the inclination angle 2130 is negative, as may be the case during a printing stroke performed by the squeegee 2830 in the second direction 2.

An advantage of the print head 110 shown in FIGS. 28-29 is that the vertical distance between the rotation axis 2850 and the screen is very small, even smaller than in the print head shown in FIG. 27. When the inclination angle 2130 is adjusted by rotating the rotatable support 2820, a horizontal displacement of the squeegee is very small. A further advantage is that a single squeegee suffices for performing printing strokes in both the first direction 1 and the second direction 2. A further advantage is that a squeegee with a rectangular end portion can be used, providing the advantages thereof as described above.

A print head as described herein may include a body portion and a rotatable support rotatably mounted to the body portion. A pressure application instrument as described herein may include a squeegee mounted to the rotatable support. The squeegee may have a rectangular end portion. The actuator arrangement may be configured to rotate the rotatable support to adjust an inclination angle of the pressure application instrument. The method described herein may include performing a first printing operation during the first printing stroke by the squeegee, wherein an inclination angle of the pressure application instrument is positive. The method may include adjusting the inclination angle of the pressure application instrument from a positive angle to a negative angle by an actuator arrangement connected to the rotatable support. The inclination angle may be adjusted by rotating the rotatable support with respect to a rotation axis that may extend through the squeegee. The method may include performing a second printing operation during the second printing stroke by the squeegee, wherein the inclination angle of the pressure application instrument is negative.

FIG. 30 shows an example of a print head 110 as described herein. The print head 110 may include a body portion 3010. The actuator arrangement 2150 may include a first actuator 3042 and a second actuator 3044. The first actuator 3042 and the second actuator 3044 may be disposed on opposite sides of the print head 110, particularly on opposite sides of the body portion 3010. The first actuator 3042 and/or the second actuator 3044 may be linear motors. The first actuator 3042 and/or the second actuator 3044 may be configured to provide a movement in an up-down direction. The first actuator 3042 and/or the second actuator 3044 may be movable relative to the body portion 3010 in an up-down direction.

The first actuator may be connected to a first hinge portion 3022. The first actuator 3042 may be configured for moving at least part of the first hinge portion 3022 upward and/or downward. The first hinge portion 3022 may include a first rotation axis 3052 that may be disposed at an upper part of the first hinge portion 3022. The first rotation axis 3052 may be a substantially horizontal rotation axis. A force applied to the first hinge portion 3022 by the first actuator 3042 may cause the upper part of the first hinge portion 3022 to move downward or upward and may cause the first hinge portion 3022 to rotate with respect to the first rotation axis 3052.

The second actuator may be connected to a second hinge portion 3024. The second actuator 3044 may be configured for moving at least part of the second hinge portion 3024 upward and/or downward. The second hinge portion 3024 may include a second rotation axis 3054 that may be disposed at an upper part of the second hinge portion 3024. The second rotation axis 3054 may be a substantially horizontal rotation axis. A force applied to the second hinge portion 3024 by the second actuator 3044 may cause the upper part of the second hinge portion 3024 to move downward or upward and may cause the second hinge portion 3024 to rotate with respect to the second rotation axis 3054.

The first hinge portion 3022 may be joined to the second hinge portion 3024 at a bottom portion of the first hinge portion 3022 and/or at a bottom portion of the second hinge portion 3024. The pressure application instrument 512 of the print head 110 may include a squeegee 3030. The squeegee 3030 may be the only squeegee of the pressure application instrument 512. The squeegee 3030 may have an end portion with a tapered shape. Alternatively, the end portion may have a rectangular shape. An upper portion of the squeegee may be connected to a bottom portion of the first hinge portion 3022 or to a bottom portion of the second hinge portion 3024. The orientation of the squeegee 3030 relative to the first hinge portion 3022 and/or relative to the second hinge portion 3024 may be fixed.

The pressure application instrument 512 may have a principal axis 3060 (or principal plane). The principal axis 3060 may extend in a length direction of the squeegee 3030. The first actuator 3042 and the second actuator 3044 may be on opposite sides of the principal axis 3060. The first rotation axis 3052 and the second rotation axis 3054 may be on opposite sides of the principal axis 3060.

FIG. 30(*a*) shows the print head 110 in a vertical orientation. The principal axis 3060 extends vertically (or substantially vertically). The inclination angle of the pressure application instrument 512 is zero.

FIGS. 30(*b-c*) show the print head 110 in inclined orientations. An inclination angle 2130 between the principal axis 3060 (or principal plane) and a vertical reference axis 3070 (or vertical reference plane) is provided. In FIG. 30(*b*), the inclination angle 2130 is positive, as may be the case during a printing stroke performed by the squeegee in the first direction 1. A positive inclination angle may be provided by moving the first hinge portion 3022 downward and/or moving the second hinge portion 3024 upward, resulting in an angular movement of the squeegee 3030 towards the left. In FIG. 30(*c*), the inclination angle 2130 is negative, as may be the case during a printing stroke performed by the squeegee in the second direction 2. A negative inclination angle may be provided by moving the first hinge portion 3022 upward and/or moving the second hinge portion 3024 downward, resulting in an angular movement of the squeegee 3030 towards the right.

An advantage of the print head 110 shown in FIG. 30 is that the design in question leads to a particularly light print head, i.e. a print head with a small weight. Further, a squeegee having an end portion with a tapered shape has advantages as described above. A further advantage is that a single squeegee suffices for performing printing strokes in both the first direction 1 and the second direction 2.

A print head as described herein may include an actuator arrangement. The actuator arrangement may include a first actuator and a second actuator. The first actuator and the second actuator may be linear motors. The pressure application instrument of the print head may include a squeegee. The first actuator and the second actuator may be connected to the squeegee. The first actuator and the second actuator may each be configured to provide a movement in an up-down direction to adjust an inclination angle of the pressure application instrument. The method described herein may include performing a first printing operation during the first printing stroke by the squeegee, wherein an inclination angle of the pressure application instrument is positive. The method may include adjusting the inclination angle of the pressure application instrument from a positive angle to a negative angle by the actuator arrangement. The inclination angle may be adjusted by providing a movement in an up-down direction by the first actuator and/or by providing a movement in an up-down direction by the second actuator. The method may include performing a second printing operation during the second printing stroke by the squeegee, wherein the inclination angle of the pressure application instrument is negative.

FIG. 31 shows an example of a print head 110 as described herein. The print head 110 may include a curved guide 3120, particularly an arc-shaped guide or C-shaped guide. The pressure application instrument 512 may include a squeegee 3130. The squeegee 3130 may be the only squeegee of the pressure application instrument 512. The squeegee 3130 may have a rectangular end portion. An upper portion of the squeegee 3130 may be movably coupled to the curved guide 3120. The curved guide 3120 may be stationary. The curved guide 3120 may not be configured to rotate. The actuator arrangement 2150 (not shown in FIG. 31) may be connected to the squeegee 3130 to move the upper portion of the squeegee relative to the curved guide 3120. Therein, the upper portion of the squeegee 3130 may move along a curved trajectory defined by the curved guide 3120. The movement of the upper portion of the squeegee 3130 relative to the curved guide 3120 may result in an adjusting of the inclination angle of the squeegee. The actuator arrangement 2150 may include a linear motor. The pressure application instrument 512 may have a principal axis 3160 (or principal plane). As shown, the principal axis 3160 may extend in a length direction of the squeegee 3130.

FIG. 31(*a*) shows the print head 110 in a vertical orientation. The principal axis 3160 extends vertically (or substantially vertically). The inclination angle of the pressure application instrument 512 is zero. FIGS. 31(*b-c*) show the print head 110 in inclined orientations. An inclination angle 2130 between the principal axis 3160 (or principal plane) and a vertical reference axis 3170 (or reference plane) is provided. In FIG. 31(*b*), the inclination angle 2130 is positive, as may be the case during a printing stroke performed by the squeegee 3130 in the first direction 1. A positive inclination angle may be provided by moving the upper portion of the squeegee to a first side of the curved guide 3120. In FIG. 31(*c*), the inclination angle 2130 is negative, as may be the case during a printing stroke performed by the squeegee 3130 in the second direction 2. A negative inclination angle may be provided by moving the upper portion of the squeegee to a second side of the curved guide 3120 opposite the first side.

An advantage of the print head 110 shown in FIG. 31 is that the center of rotation is very low. When the inclination angle 2130 is adjusted by moving the squeegee 3130 along the curved guide 3120, a horizontal displacement of the squeegee 3130 is very small. A further advantage is that a single squeegee suffices for performing printing strokes in both the first direction 1 and the second direction 2. A further advantage is that a squeegee 3130 with a rectangular end portion can be used, providing the advantages thereof as described above.

A print head as described herein may include a curved guide. A pressure application instrument of the print head may include a squeegee movably coupled to the curved guide. The actuator arrangement may be configured to move the squeegee relative to the curved guide to adjust an inclination angle of the pressure application instrument. A portion of the squeegee may be moved along a curved trajectory defined by the curved guide. The method described herein may include performing a first printing operation during the first printing stroke by the squeegee, wherein an inclination angle of the pressure application instrument is positive. The method may include adjusting the inclination angle of the pressure application instrument from a positive angle to a negative angle by the actuator arrangement. The inclination angle may be adjusted by moving the squeegee relative to the curved guide. The method may include performing a second printing operation during the second printing stroke by the squeegee, wherein the inclination angle of the pressure application instrument is negative.

Each of the print heads shown in FIGS. 27-31 may include a vertical positioning actuator as described herein. Further, the print heads shown in FIGS. 27-31 may be used for performing the method described herein, and the features of the print heads in question may in particular be combined with any of the aspects described in relation to FIGS. 1 to 25.

According to a further embodiment, a method of performing screen printing on a substrate used for the manufacture of a solar cell is provided. The method includes moving a print head over a screen by a first drive actuator from an initial position to a final position to perform a printing stroke in a first direction, the final position being spaced apart from the initial position by a total stroke distance of the printing stroke. The method includes moving a material processing head over the screen by a second drive actuator to perform a flooding stroke in the first direction. The print head is moved away from the material processing head during at least a portion of the printing stroke to increase a separation distance between the print head and the material processing head. The flooding stroke is started when the print head reaches a target position spaced apart from the initial position by 50% or more of the total stroke distance.

Figure 32:
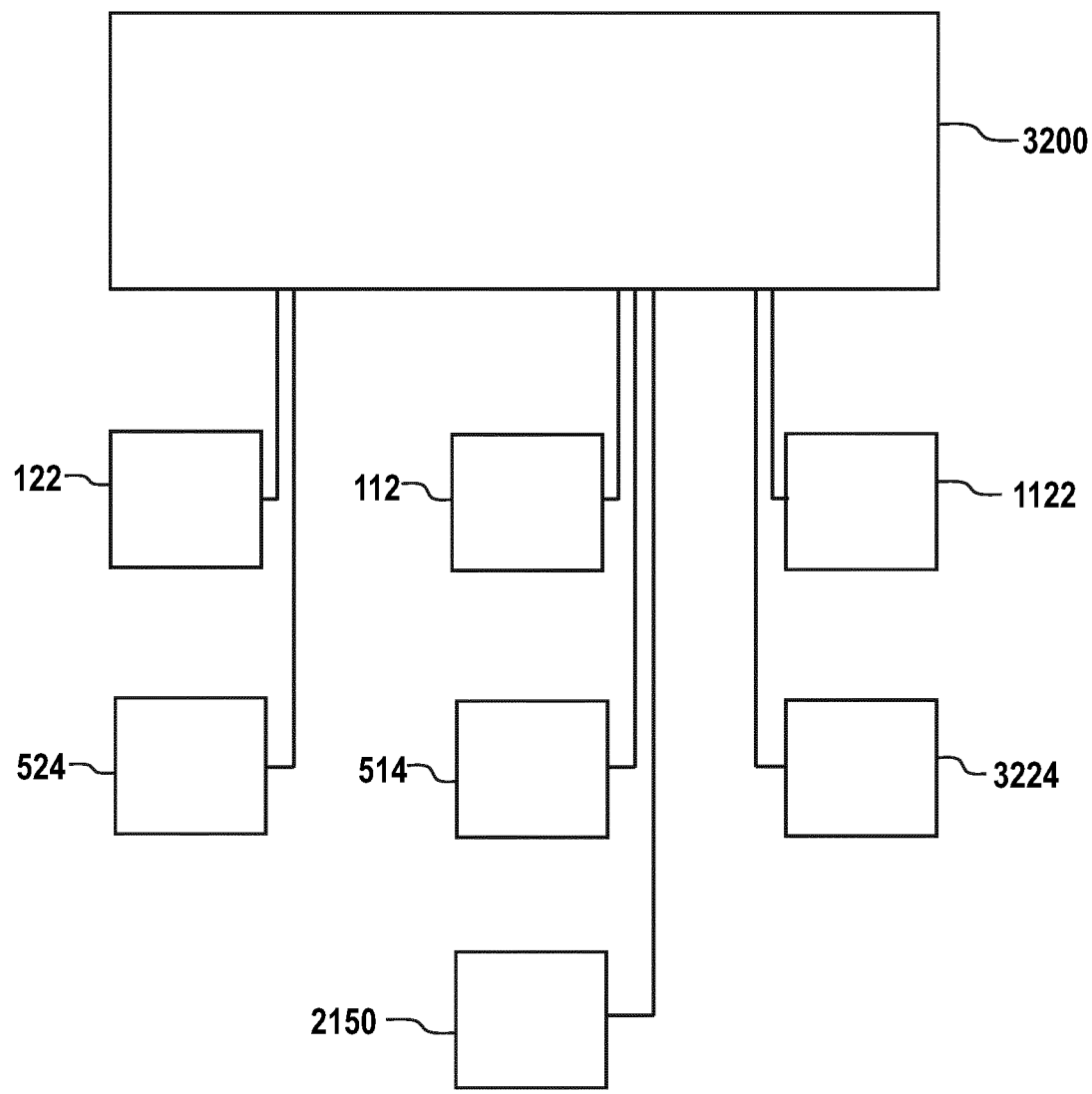
FIG. 32 shows a controller for controlling an apparatus for performing screen printing on a substrate used for the manufacture of a solar cell.

FIG. 32 shows a controller 3200 according to embodiments described herein. The controller may include a computer or a network of computers. The controller may be configured for receiving input data, for processing the input data and for issuing output data, for example in the form of instructions. The controller 3200 may be connected to any of the following parts: the first drive actuator 112; or the second drive actuator 122; or the third drive actuator 1122; or the vertical positioning actuator 514 of the print head 110; or the vertical positioning actuator 524 of the material processing head 120; or a vertical positioning actuator 3224 of the material processing head 1120; or the actuator arrangement 2150 of the print head 110; or any combination thereof. The controller 3200 may control the aforementioned parts in the manner described herein.

According to a further embodiment, a controller for an apparatus for performing screen printing on a substrate used for the manufacture of a solar cell is provided. The controller is configured to control a first drive actuator to move a print head over a screen to perform a printing stroke in a first direction. The controller is configured to control a second drive actuator to move a material processing head over the screen to perform a material processing stroke in the first direction. Therein, the first drive actuator and the second drive actuator are controlled such that the material processing head is behind the print head during the material processing stroke, and such that the print head is moved away from the material processing head during a distance increasing phase of the printing stroke to increase a separation distance between the print head and the material processing head.

The controller may be configured to perform any aspect, or any combination of aspects, of the method described herein.

The controller may be configured to control the second drive actuator such that the material processing head is substantially stationary with respect to the first direction during the distance increasing phase.

The controller may be configured to control the second drive actuator to move the material processing head toward the print head during a distance decreasing phase of the material processing stroke to decrease the separation distance between the print head and the material processing head, the distance decreasing phase being performed after the distance increasing phase.

The controller may be configured to control the first drive actuator and the second drive actuator such that an average stroke speed of the material processing head during the material processing stroke is higher than an average stroke speed of the print head during the printing stroke, so that a duration of the material processing stroke is shorter than a duration of the printing stroke.

The controller may be configured to control a vertical positioning actuator such that a vertical position of a flooder of the material processing head during the material processing stroke is substantially constant.

The print head may be configured to be moved in the first direction from an initial position to a final position to perform the printing stroke, the final position being spaced apart from the initial position by a total stroke distance of the printing stroke. The controller may be configured to control the first drive actuator and/or the second drive actuator such that a maximum separation distance between the print head and the material processing head reached during the distance increasing phase is 50% or more, 70% or more, or even 90% or more of the total stroke distance.

The controller may be configured to control the second drive actuator such that the material processing stroke starts after the printing stroke has started and/or before the printing stroke has ended.

The print head may be configured to be moved in the first direction from an initial position to a final position to perform the printing stroke, the final position being spaced apart from the initial position by a total stroke distance of the printing stroke. The controller may be configured to control the second drive actuator such that the material processing stroke starts when the print head reaches a target position. The target position may be spaced apart from the initial position by 50% or more, 70% or more, or even 90% or more of the total stroke distance. The target position may substantially correspond to a position of a first edge of the substrate or substrate receiving region.

A pressure application instrument of the print head may be inclined at an inclination angle when applying pressure to the screen, as described herein. The controller may be connected to an actuator arrangement to control the inclination angle of the pressure application instrument during at least a portion of a printing stroke.

The printing stroke may be a first printing stroke. The material processing head may be a first material processing head. The material processing stroke may be a first material processing stroke. The controller may be configured to control the first drive actuator to move the print head in a second direction opposite to the first direction to perform a second printing stroke. The controller may be configured to control a third drive actuator to move a second material processing head to perform a second material processing stroke in the second direction.

The controller may be configured to control the first drive actuator to move the print head away from the second material processing head during a distance increasing phase of the second printing stroke to increase a separation distance between the print head and the second material processing head. The controller may be configured to control the third drive actuator such that the second material processing head is substantially stationary with respect to the second direction during the distance increasing phase of the second printing stroke. The controller may be configured to control the third drive actuator such that the second material processing stroke starts after the second printing stroke has started and/or before the second printing stroke has ended. The controller may be configured to control the third drive actuator to move the second material processing head toward the print head during a distance decreasing phase of the second material processing stroke to decrease the separation distance between the print head and the second material processing head. The controller may be configured to control the first drive actuator and the third drive actuator such that an average stroke speed of the second material processing head during the second material processing stroke is higher than an average stroke speed of the print head during the second printing stroke, so that a duration of the second material processing stroke is shorter than a duration of the second printing stroke. The controller may be configured to control a vertical positioning actuator such that a vertical position of a flooder of the second material processing head is substantially constant during the second material processing stroke. The controller may be configured to control the first drive actuator and/or the third drive actuator such that a maximum separation distance between the print head and the second material processing head reached during the second printing stroke is 50% or more, 70% or more or even 90% or more of a total stroke distance of the second printing stroke. The controller may be configured to control the third drive actuator such that the second material processing stroke starts when the print head reaches a target position. The target position may be spaced apart from the initial position of the second printing stroke by 50% or more, 70% or more or even 90% of the total stroke distance of the second printing stroke. The target position may substantially correspond to a position of a second edge of the substrate or substrate receiving region.

The inclination angle of the pressure application instrument may be positive during at least a portion of the first printing stroke. The controller may be configured to control the actuator arrangement of the print head to perform an angular movement of the pressure application instrument to change the inclination angle from a positive angle to a negative angle. The controller may be configured to control the first drive actuator to move the print head in the second direction while the pressure application instrument transfers material from the screen to the substrate at a negative inclination angle of the pressure application instrument during at least a portion of the second printing stroke.

According to a further embodiment, an apparatus for performing screen printing on a substrate used for the manufacture of a solar cell is provided. The apparatus includes a screen. The apparatus includes a print head. The apparatus includes a first drive actuator connected to the print head to move the print head in at least a first direction. The apparatus includes a material processing head. The apparatus includes a second drive actuator connected to the material processing head to move the material processing head in at least the first direction. The apparatus includes a controller connected to the first drive actuator and the second drive actuator, the first drive actuator and the second drive actuator being individually controllable. The controller is configured to control the first drive actuator to move the print head over the screen to perform a printing stroke in the first direction. The controller is configured to control the second drive actuator to move the material processing head over the screen to perform a material processing stroke in the first direction. Therein, the material processing head is behind the print head during the material processing stroke, and the print head is moved away from the material processing head during a distance increasing phase of the printing stroke to increase a separation distance between the print head and the material processing head. The controller can be a controller according to embodiments described herein. The apparatus can be configured to perform any feature, or any combination of features, of the method described herein. The apparatus may be a solar cell production apparatus.

The apparatus may include a substrate receiving region for receiving a substrate. The print head may include a pressure application instrument. The apparatus, more specifically the print head, may include a vertical positioning actuator to adjust a vertical position of the pressure application instrument. The apparatus, more specifically the print head, may include an actuator arrangement to adjust an inclination angle of the pressure application instrument.

The material processing head may include a flooder. The apparatus, more specifically the material processing head, may include a vertical positioning actuator to adjust a vertical position of the flooder.

The printing stroke may be a first printing stroke. The material processing stroke may be a first material processing stroke. The first drive actuator may be configured to move the print head in a second direction opposite to the first direction to perform a second printing stroke. The second drive actuator may be configured to move the material processing head in the second direction to perform a second material processing stroke.

The material processing head may be a first material processing head. The apparatus may include a second material processing head. The second material processing head may include a flooder, or flood bar. The apparatus may include a third drive actuator connected to the second material processing head. The first drive actuator, the second drive actuator and the third drive actuator may be individually controllable. The third drive actuator may be configured to move the second material processing head in the first direction and/or the second direction. The third drive actuator may be configured to move the second material processing head in the second direction to perform a second material processing stroke. The apparatus, more specifically the second material processing head, may include a vertical positioning actuator to adjust a vertical position of the flooder of the second material processing head.

The print head may include a pressure application instrument including a first squeegee and a second squeegee both mounted to a portion of the print head in an inclined orientation relative to each other. The apparatus may include an actuator arrangement connected to the pressure application instrument to adjust an inclination angle of the pressure application instrument.

While the foregoing is directed to embodiments of the disclosure, other and further embodiments of the disclosure may be devised without departing from the basic scope thereof, and the scope thereof is determined by the claims that follow.

The invention claimed is:

1. A method of performing screen printing on a substrate used for the manufacture of a solar cell, comprising:
moving a print head over a screen by a first drive actuator to perform a printing stroke in a first direction; and
moving a material processing head in the first direction by a second drive actuator to perform a material processing stroke behind the print head,
the print head being moved away from the material processing head by the first drive actuator during a distance increasing phase of the printing stroke to increase a separation distance between the print head and the material processing head, an average stroke speed of the material processing head during the material processing stroke being higher than an average stroke speed of the print head during the printing stroke so that a duration of the material processing stroke is shorter than a duration of the printing stroke.

2. The method of claim 1, wherein the print head is moved in the first direction from an initial position to a final position to perform the printing stroke, the final position being spaced apart from the initial position by a total stroke distance of the printing stroke, wherein a maximum separation distance between the print head and the material processing head reached during the distance increasing phase is 50% or more of the total stroke distance.

3. A controller for an apparatus for performing screen printing on a substrate used for the manufacture of a solar cell, the controller being configured to:
control a first drive actuator to move a print head over a screen to perform a printing stroke in a first direction; and
control a second drive actuator to move a material processing head over the screen to perform a material processing stroke in the first direction,
the first drive actuator and the second drive actuator being controlled such that the material processing head is behind the print head during the material processing stroke, and such that the print head is moved away from the material processing head during a distance increasing phase of the printing stroke to increase a separation distance between the print head and the material processing head, an average stroke speed of the material processing head during the material processing stroke being higher than an average stroke speed of the print head during the printing stroke so that a duration of the material processing stroke is shorter than a duration of the printing stroke.

4. The method of claim 1, wherein the material processing head is substantially stationary with respect to the first direction during the distance increasing phase.

5. The method of claim 1, wherein the material processing stroke starts after the printing stroke has started and/or before the printing stroke has ended.

6. The method of claim 1, wherein the print head is moved in the first direction from an initial position to a final position to perform the printing stroke, the final position being spaced apart from the initial position by a total stroke distance of the printing stroke, wherein the material processing stroke starts when the print head reaches a target position spaced apart from the initial position by 50% or more of the total stroke distance.

7. The method of claim 1, further comprising:
moving the material processing head toward the print head by the second drive actuator during a distance decreasing phase of the material processing stroke to decrease the separation distance between the print head and the material processing head, the distance decreasing phase being performed after the distance increasing phase.

8. The method of claim 1, wherein a vertical position of the material processing head or a vertical position of a flooder of the material processing head is substantially constant during the material processing stroke.

9. The method of claim 1, further comprising:
applying a pressure to the screen by a pressure application instrument of the print head to transfer material from the screen to the substrate during at least a portion of the printing stroke.

10. The method of claim 9, wherein the pressure application instrument is inclined at an inclination angle when applying the pressure to the screen, wherein the method further comprises:
controlling the inclination angle of the pressure application instrument during at least a portion of the printing stroke.

11. The method of claim 1, wherein the printing stroke is a first printing stroke, the material processing head is a first material processing head and the material processing stroke is a first material processing stroke, the method further comprising:
moving the print head in a second direction opposite to the first direction to perform a second printing stroke; and
moving a second material processing head by a third drive actuator to perform a second material processing stroke in the second direction.

12. The method of claim 11, wherein an inclination angle of the pressure application instrument is positive during at least a portion of the first printing stroke, the method further comprising:
performing an angular movement of the pressure application instrument to change the inclination angle from a positive angle to a negative angle; and
applying a pressure to the screen by the pressure application instrument to transfer material from the screen to the substrate at a negative inclination angle of the pressure application instrument during at least a portion of the second printing stroke.

13. The method of claim 11, wherein the pressure application instrument includes a first squeegee and a second squeegee both mounted to a portion of the print head in an inclined orientation relative to each other, wherein the method further comprises:
performing a first printing operation during the first printing stroke by the first squeegee, wherein an inclination angle of the pressure application instrument is positive;
adjusting the inclination angle of the pressure application instrument from a positive angle to a negative angle by an actuator arrangement; and
performing a second printing operation during the second printing stroke by the second squeegee, wherein the inclination angle of the pressure application instrument is negative.

14. The controller of claim 3, wherein the controller is configured for performing the method of claim 2.

15. An apparatus for performing screen printing on a substrate used for the manufacture of a solar cell, comprising:

a screen:

a print head;

a first drive actuator connected to the print head to move the print head in at least a first direction;

a material processing head;

a second drive actuator connected to the material processing head to move the material processing head in at least the first direction; and the controller according to claim 3 connected to the first drive actuator and the second drive actuator, the first drive actuator and the second drive actuator being individually controllable.

16. The apparatus of claim 15, wherein the material processing head is a first material processing head and the material processing stroke is a first material processing stroke, the apparatus further comprising:

a second material processing head; and a third drive actuator connected to the second material processing head, wherein the third drive actuator is configured to move the second material processing head in a second direction opposite to the first direction to perform a second material processing stroke.

17. The apparatus of claim 15, wherein the print head includes a pressure application instrument, wherein the apparatus comprises an actuator arrangement connected to the pressure application instrument to adjust an inclination angle of the pressure application instrument.

18. The apparatus of claim 17, wherein the pressure application instrument includes a first squeegee and a second squeegee both mounted to a portion of the print head in an inclined orientation relative to each other.

* * * * *